(12) United States Patent
Kuroda et al.

(10) Patent No.: US 8,476,756 B2
(45) Date of Patent: Jul. 2, 2013

(54) SEMICONDUCTOR DEVICE AND HEAT SINK WITH 3-DIMENSIONAL THERMAL CONDUCTIVITY

(75) Inventors: Naotaka Kuroda, Tokyo (JP); Akio Wakejima, Tokyo (JP); Masahiro Tanomura, Tokyo (JP); Hironobu Miyamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/137,927

(22) Filed: Sep. 21, 2011

(65) Prior Publication Data

US 2012/0012995 A1 Jan. 19, 2012

Related U.S. Application Data

(62) Division of application No. 12/311,701, filed as application No. PCT/JP2007/001169 on Oct. 25, 2007, now Pat. No. 8,063,484.

(30) Foreign Application Priority Data

Nov. 2, 2006 (JP) .................................. 2006-299670
Sep. 28, 2007 (JP) .................................. 2007-254832

(51) Int. Cl.
*H01L 23/34* (2006.01)
*H01L 23/10* (2006.01)

(52) U.S. Cl.
USPC ..... 257/712; 257/706; 257/720; 257/E23.051

(58) Field of Classification Search
USPC ........................... 257/706, 712, 720, E23.051
See application file for complete search history.

(56) References Cited

U.S. PATENT DOCUMENTS

| 4,482,912 | A  | * | 11/1984 | Chiba et al. .................. 257/746 |
| 6,821,625 | B2 |   | 11/2004 | Chu et al. |
| 6,837,306 | B2 |   | 1/2005  | Houle et al. |
| 7,004,243 | B1 | * | 2/2006  | Babcock et al. .............. 165/185 |

(Continued)

FOREIGN PATENT DOCUMENTS

| JP | 02032553 A  | 2/1990 |
| JP | 10-107190 A | 4/1998 |

(Continued)

OTHER PUBLICATIONS

European Search Report dated Apr. 26, 2010.

(Continued)

*Primary Examiner* — Teresa M Arroyo
(74) *Attorney, Agent, or Firm* — McGinn Intellectual Property Law Group, PLLC

(57) ABSTRACT

A semiconductor device includes a semiconductor element having a rectangular two-dimensional geometry and serving as a heat source, a first heat sink section including the semiconductor element mounted thereon, and a second heat sink section joined to an opposite side of the first heat sink section that includes the semiconductor element. A relation among directional components of thermal conductivity is $K1yy \geq K1xx > K1zz$, where directional components of a three-dimensional thermal conductivity of the heat sink section in X, Y, and Z directions are determined as $Kxx$, $Kyy$, and $Kzz$. A relation among directional components of a thermal conductivity of the second heat sink section is $K2zz \geq K2yy > K2xx$ or $K2yy \geq K2zz > K2xx$, where the directional components of the thermal conductivity of the second heat sink section in X, Y, and X directions are determined as $K2xx$, $K2yy$, and $K2zz$.

11 Claims, 19 Drawing Sheets

U.S. PATENT DOCUMENTS

| | | | |
|---|---|---|---|
| 7,456,492 B2 * | 11/2008 | Mochida | 257/659 |
| 7,514,783 B2 * | 4/2009 | Shimokawa et al. | 257/706 |
| 2002/0149102 A1 * | 10/2002 | Hashemi et al. | 257/706 |
| 2002/0185269 A1 | 12/2002 | Sato | |
| 2003/0003287 A1 | 1/2003 | Tobita | |
| 2003/0060108 A1 | 3/2003 | Chu et al. | |
| 2003/0116312 A1 | 6/2003 | Krassowski et al. | |
| 2004/0118501 A1 * | 6/2004 | Chiu et al. | 156/64 |
| 2004/0206478 A1 | 10/2004 | Delano et al. | |
| 2004/0232544 A1 | 11/2004 | Mochizuki et al. | |
| 2004/0262740 A1 * | 12/2004 | Matayabas et al. | 257/706 |
| 2005/0077617 A1 * | 4/2005 | Hirano et al. | 257/712 |
| 2005/0121776 A1 * | 6/2005 | Deppisch et al. | 257/712 |
| 2006/0011336 A1 | 1/2006 | Frul | |
| 2006/0108700 A1 * | 5/2006 | Nakazawa et al. | 257/787 |
| 2006/0145334 A1 * | 7/2006 | Tsukada et al. | 257/706 |
| 2006/0244125 A1 * | 11/2006 | Shiomi et al. | 257/706 |
| 2008/0128896 A1 * | 6/2008 | Toh et al. | 257/712 |
| 2008/0191236 A1 | 8/2008 | De Graaf et al. | |
| 2008/0290499 A1 * | 11/2008 | Nishi et al. | 257/712 |

FOREIGN PATENT DOCUMENTS

| | | |
|---|---|---|
| JP | 10-233475 A | 9/1998 |
| JP | 2003-152146 A | 5/2003 |
| JP | 2003-204021 A | 7/2003 |
| JP | 2004-356625 A | 12/2004 |
| JP | 2005-200239 A | 7/2005 |
| JP | 2007-59875 A | 3/2007 |
| JP | 2008-91369 A | 4/2008 |
| JP | 2008-91432 A | 4/2008 |

OTHER PUBLICATIONS

Japanese Office Action, dated Nov. 20, 2012 with a partial English translation.

* cited by examiner

SEMICONDUCTOR DEVICE AND HEAT SINK WITH 3-DIMENSIONAL THERMAL CONDUCTIVITY

The present Application is a Divisional Application of U.S. patent application Ser. No. 12/311,701, filed on Apr. 9, 2009 now U.S. Pat. No. 8,063,484, which is based on and claims priority from International Patent Application No. PCT/JP2007/001169, filed on Oct. 25, 2007, which is based on and claims priority from Japanese Patent Application No. 2006-299670, filed on Nov. 2, 2006 and Japanese Patent Application No. 2007-254832, filed on Sep. 28, 2007, the entire contents of which are incorporated herein by reference.

TECHNICAL FIELD

The present invention relates to a semiconductor device, and relates particularly to a high output power amplifier, a high output laser diode, light emitting diode, and the like, which are employed in a mobile phone base station, a satellite communication, radar and the like.

RELATED ART

High output power amplifiers employing semiconductors such as silicon (Si), gallium arsenide (GaAs), gallium nitride (GaN) and the like are widely applied in power amplifiers for mobile phone base stations or power amplifiers for mounting in a satellite and the like. Higher output power exceeding 100 W is demanded for the amplifier in these applications. On the other hand, miniaturization is required for these amplifiers, resulting in an increased output power density. When the output power density is considerably increased, a channel temperature of a field effect transistor (FET) that constitutes the amplifier is considerably increased, causing harmful influence in the long term reliability of the FET. In order to prevent such deterioration in the reliability due to an increased temperature, a chip having a field effect transistor formed thereon and serving as a heat source is mounted on a heat sink, and the above-described heat sink is ordinarily formed of a metallic material, which exhibits better thermal conductivity. In general, copper (Cu) is employed as a metallic material with lower cost and better thermal conductivity, and since the linear thermal expansion coefficient of Cu is different by 3 to 6 times from the thermal expansion coefficient of the semiconductor substrate of, for example, silicon, gallium arsenide or the like, a thermal stress is exerted over the semiconductor substrate in the assembly operation, causing a problem of a deterioration in the reliability. In order to solve such problem, a material exhibiting lower linear thermal expansion coefficient such as tungsten (W), molybdenum (Mo) and the like is added to Cu, or a Cu laminated structure is employed to control the linear thermal expansion coefficient to be closer to that of the semiconductor substrate. This provides a compatibility of relatively higher thermal conductivity with a linear thermal expansion coefficient, which is closer to that of the semiconductor substrate.

Since an increase in the bonding temperature due to a self heating in a high output power laser diode a light emitting diode employing a compound semiconductor such as GaAs and the like or adversely affects the reliability of the device, the chip is also mounted on the heat sink in the similar way for releasing the heat. In such case, a type of a material such as aluminum nitride (AlN) is also employed for the purpose of providing better balance of the higher heat conductivity with the lower thermal stress.

However, in recent years, the requirements for miniaturization and higher power are increased in the high-power amplifiers such as power amplifiers for mobile phone base stations as described above, and thus the use of heat sink materials such as CuW, CuMo and the like cannot provide sufficient channel temperature (warranty temperature: for example, about 120 to 150 degree C. for GaAs or Si) for ensuring sufficiently higher reliability in the FET. Although it is necessary to further reduce the thermal resistance of the semiconductor device for solving such problem, the thermal resistance component of the package is larger than the thermal resistance component of the semiconductor element, when a large-scale semiconductor element such as high-power amplifier is employed, and so a reduction in the thermal resistance component of the package is required for reducing the thermal resistance of the whole system. In addition, increased power is expected in the high power laser diode or the light emitting diode, and thus a reduced thermal resistance of the heat sink is required.

Meanwhile, it is necessary to provide an increased ratio of Cu component having larger thermal conductivity for obtaining further reduced thermal resistance in the conventional metallic heat sink materials such as CuW or MoCu employed in the high-power amplifier, but since Cu exhibits higher thermal expansion coefficient of 17 ppm/K, such increased rate of Cu component causes an increased thermal expansion coefficient of the heat sink material. This causes an increase in the difference of the thermal expansion coefficient between the heat sink and the semiconductor substrate, and an increase in the temperature during the assembly operation causes an increased thermal stress exerted over the semiconductor element, leading to a problem of deteriorating the reliability. The use of the metallic heat sink cause a problem of a difficulty in further increasing the thermal conductivity while maintaining sufficiently smaller thermal stress in the above-described reason. In order to provide solutions for the problem, examples of employing a graphite material with higher heat conduction or a carbon-based composite material as a heat sink material are disclosed in Japanese Patent Laid-Open No. 2005-200, 239, Japanese Patent Laid-Open No. H 10-233,475 and Japanese Patent Laid-Open No. H 10-107,190. These proposals achieve a better compatibility of relatively higher thermal conductivity with lower thermal stress.

[Patent Document 1] Japanese Patent Laid-Open No. 2005-200,239,

[Patent Document 2] Japanese Patent Laid-Open No. H 10-233,475

[Patent Document 3] Japanese Patent Laid-Open No. H 10-107,190

DISCLOSURE OF THE INVENTION

Problem to be Solved by the Invention

However, the above-described materials exhibits anisotropy in the thermal conductivity, and a direction for higher thermal conductivity is present, and on the other hand, a direction for lower thermal conductivity is also present. Therefore, it is concerned that the heat-release ability is not improved and maintained at a level equivalent to that of the conventional metallic heat sink or AlN, or deteriorated, due to the geometry of the semiconductor element serving as the heat source and/or the direction of the arrangement of such semiconductor element. Therefore, concerning the relative direction of the semiconductor element serving as the heat source with the heat sink section, it is critical to adopt a new design concept in the heat-releasing, which is different from the design concept for the heat sink exhibiting isotropic thermal conductivity like the conventional metallic material. In addition, even if the direction of the semiconductor element is determined, the relative direction in a plane (two-dimensional direction) is not sufficient, and it is critical to determine the three-dimensional relative orientation.

The present invention is made on the basis of the above-described circumstances, and an object of the invention is to provide a semiconductor device having enhanced heat-release ability and improved reliability by defining three-dimensional relative direction of the semiconductor element having a rectangular two-dimensional geometry and serving as a heat source with the heat sink.

Means for Solving Problem

According to one aspect of the present invention, there is provided a semiconductor device, comprising: a semiconductor element having a rectangular two-dimensional geometry and serving as a heat source; and a heat sink section having the above-described semiconductor element mounted thereon, wherein a direction for exhibiting the smallest directional components of a thermal conductivity of the above-described heat sink section in X, Y and Z directions is in parallel to a direction except Z direction, where the longer side direction of the above-described semiconductor element is defined as X direction, the shorter side direction thereof is defined as Y direction and the thickness direction is defined as Z direction.

In the above-described aspect of the present invention, a direction for exhibiting the smallest directional components of a thermal conductivity of the above-described heat sink section in X, Y and Z directions may be in parallel to X direction.

In the above-described aspect of the present invention, a relation among the directional components of the above-described thermal conductivity may be: $Kzz \geqq Kyy > Kxx$, where directional components of three-dimensional thermal conductivity of the above-described heat sink section in X, Y and Z directions are determined as Kxx, Kyy and Kzz.

In the above-described aspect of the present invention, the above-described heat sink section may include metallic layers in at least a front surface and a back surface thereof.

In the above-described aspect of the present invention, a bonding layer may be included in an interface between the above-described metallic layer and the above-described heat sink section.

In the above-described aspect of the present invention, a plurality of the above-described semiconductor elements are included, and the above-described semiconductor elements are aligned in series along the longer side direction of the above-described semiconductor element.

In the above-described aspect of the present invention, at least two directional components of the above-described thermal conductivity of the above-described heat sink section in X, Y and Z directions may be equal to or higher than 600 W/mK, the above-described heat sink section having anisotropic thermal conductivity.

The reduction in the thermal resistance of the semiconductor device having such configurations of the present invention as compared with the thermal resistance of a metallic package that employs a material exhibiting an isotropic thermal conductivity will be described as follows in reference to FIG. 18 and FIG. 19.

FIG. 18 is a schematic perspective view of a semiconductor device having a semiconductor element that is a gallium nitride based FET mounted on a package, and a thermal simulation via finite element method is conducted by utilizing such device. The components other than the components necessary to conduct the simulation are not presented in the drawings. In FIG. 18, 80 indicates a semiconductor element (GaNFET/SiC substrate), 81 indicates a region for heat generation, 82 indicates AuSn solder, 83 indicates a heat sink section, 84 indicates a Cu foil (metallic layer) and 85 indicates bonding layer. The semiconductor element 80 has a rectangular two-dimensional geometry, and serves as a heat source. The longer side direction of the semiconductor element 80 is defined as X direction, the shorter side direction thereof is defined as Y direction and the thickness direction is defined as Z direction. Concerning the semiconductor device as shown in FIG. 18, calculations are made to know how the temperature rise is changed in the heat source (active region of device) and the heat sink back surface by employing thermal simulation via finite element method, when the direction of the heat sink section having anisotropic thermal conductivity is changed.

The conditions of the simulation are as follows. In the present simulation, a semiconductor device having a semiconductor element 80 including a gallium nitride based FET formed on a SiC substrate, which is mounted on a package, which include a heat sink section 83 having copper (Cu) foils 84 formed in a front surface and a back surface thereof, is employed. The heat sink section 83 is a carbon based composite material impregnated with copper (Cu). A bonding layer 85 having a thermal conductivity of 30 W/mK is disposed in an interface between the Cu foil 84 and the heat sink section 83. A power consumption of 100 W is provided to the region for generating heat (active region of device) 81 of such semiconductor device to fix a temperature of the back surface of the package at 25 degree C. This corresponds to the situation where the next level heat sink is disposed under the back surface of the package (Z direction).

The directional components of the thermal conductivity of the carbon based composite material of the heat sink section 83 in X, Y, and Z directions are 540 W/mK, 450 W/mK and 140 W/mK, respectively. In the thermal simulation, the average temperature increase of the respective active regions 81 are calculated when sets of the directional components of the thermal conductivity of the carbon based composite material of the heat sink section 83 in X, Y, and Z directions are selected (FIG. 19).

FIG. 19 is a graph, showing the results of the thermal simulations. It can be understood from FIG. 19 that, when the smallest component (140 W/mK) in the directional components of the thermal conductivity in X, Y, and Z directions is selected to coincide with Z direction, the temperature rise is almost equivalent to the conventional heat sink composed of a metal (CuMo). On the contrary, it can also be understood that, when the smallest component in the directional components of the thermal conductivity in X, Y, and Z directions is selected to coincide with a direction other than Z direction, a considerable decrease in the temperature of 30 degree C. or more can be achieved, as compared with the conventional heat sink composed of a metal (CuMo). Further, it can also be understood that the temperature rise is further reduced when the smallest components in the directional components of the thermal conductivity in X, Y, and Z directions is oriented toward X axis, which coincides with a direction to be parallel along the longer side (direction in longer side) of the device active region 81, among the sets of the directional components of the thermal conductivity in X, Y, and Z directions that achieves larger decrease in the temperature, as compared with the case that the smallest components is oriented toward Y axis, which coincides with a direction to be parallel along the shorter side (direction in shorter side) of the device active region 81.

Next, in order to verify an adequacy of the present simulation, experimental manufactures and evaluations are conducted for the set of the directional components of the thermal conductivity in X, Y, and Z directions, which achieves the highest reduction in the temperature rise in the present simulation, and more specifically, for the set of the directional components of 450 W/mK in X direction, 140 W/mK in Y direction, and 540 W/mK in Z direction. The heat sink structure is composed of the carbon based composite material having Cu foils in the front surface and the back surface thereof via the bonding layer, similarly as in the simulation. It is known from the results of the present simulation that the temperature rise is reduced by about 30% for the semiconductor device of the present invention, as compared with the device employing the conventional heat sink composed of metal (CuMo). The temperature rise is estimated by experimentally producing the actual semiconductor device of the present invention and measuring the temperature of the front surface of the active region and the temperature of the back surface of the heat sink, and the about 20% of reduction is obtained, as compared with the conventional metallic heat sink.

As can be seen from the above-described simulations and the measurement results, in the semiconductor device of the present invention, relatively higher component in the directional components of the thermal conductivity is oriented toward Z direction, along which a heat sink section for the whole system is disposed, so that effective heat-releasing can be achieved, allowing a reduction in the thermal resistance of the semiconductor device. More preferably, the lowest directional component of the thermal conductivity is oriented toward the longer side direction of the heat source (X direction), so that a heat can be released more effectively from the longer side of the heat source that provides better heat release efficiency, resulting in further reduction in the thermal resistance.

According to another aspect of the present invention, there is provided a semiconductor device, comprising: a semiconductor element having a rectangular two-dimensional geometry and serving as a heat source; a first heat sink section having the semiconductor element mounted thereon, the first heat sink section being mounted right under the semiconductor element; and a second heat sink section joined to a circumference of the first heat sink section, wherein a relation among directional components of thermal conductivity of the first heat sink section is $K1_{zz} \geq K1_{yy} > K1_{xx}$ or $K1_{yy} \geq K1_{zz} > K1_{xx}$, where the longer side direction of the semiconductor element is defined as X direction, the shorter side direction thereof is defined as Y direction and the thickness direction is defined as Z direction and the directional components of thermal conductivity of the first heat sink section in X, Y and Z directions are determined as $K1_{xx}$, $K1_{yy}$ and $K1_{zz}$, and wherein a relation among directional components of thermal conductivity of the second heat sink section is $K2_{yy} \geq K2_{xx} > K2_{zz}$, where the directional components of thermal conductivity of the second heat sink section in X, Y and Z directions are determined as $K2_{xx}$, $K2_{yy}$ and $K2_{zz}$.

In the above-described aspect of the present invention, the heat sink section may include metallic layers in at least a front surface and a back surface thereof.

In the above-described aspect of the present invention, a bonding layer may be included in an interface between the metallic layer and the heat sink section.

In the above-described aspect of the present invention, a plurality of the semiconductor elements may be included, and wherein the semiconductor elements may be aligned in series along the longer side direction of the semiconductor element.

In the above-described aspect of the present invention, at least two directional components of the thermal conductivity of the heat sink section in X, Y and Z directions may be equal to or higher than 600 W/mK, the heat sink section having anisotropic thermal conductivity.

This allows effectively releasing heat toward Z direction in a region right under the semiconductor element. On the other hand, in the second heat sink section, the direction for providing higher directional components of the thermal conductivity is oriented to X and Y directions. Thus, the heat can be broadly diffused in X-Y plane in the second heat sink section to achieve the heat release. These two advantageous effects for heat release by the heat sink section allow reducing the thermal resistance of the entire semiconductor device.

According to further aspect of the present invention, there is provided a semiconductor device, comprising: a semiconductor element having a rectangular two-dimensional geometry and serving as a heat source; a first heat sink section having the semiconductor element mounted thereon; and a second heat sink section joined to the opposite side of the first heat sink section having the semiconductor element, wherein a relation among directional components of thermal conductivity is: $K1_{yy} \geq K1_{xx} > K1_{zz}$, where directional components of the three-dimensional thermal conductivity of the heat sink section in X, Y and Z directions are determined as $K_{xx}$, $K_{yy}$ and $K_{zz}$, and wherein a relation among directional components of thermal conductivity of the second heat sink section is $K2_{zz} \geq K2_{yy} > K2_{xx}$ or $K2_{yy} \geq K2_{zz} > K2_{xx}$, where the directional components of thermal conductivity of the second heat sink section in X, Y and X directions are determined as $K2_{xx}$, $K2_{yy}$ and $K2_{zz}$.

In the above-described aspect of the present invention, the heat sink section may include metallic layers in at least a front surface and a back surface thereof.

In the above-described aspect of the present invention, a bonding layer may be included in an interface between the metallic layer and the heat sink section.

In the above-described aspect of the present invention, a plurality of the semiconductor elements may be included, and the semiconductor elements may be aligned in series along the longer side direction of the semiconductor element.

In the above-described aspect of the present invention, at least two directional components of the thermal conductivity of the heat sink section in X, Y and Z directions may be equal to or higher than 600 W/mK, the heat sink section having anisotropic thermal conductivity.

This allows obtaining larger heat spread effect in the first heat sink section. Further, the reduced thickness of the first heat sink section allows an inhibition for the increase in the thermal resistance. Further, in the second heat sink section, the heat spread by the first heat sink section is released with an improved efficiency due to larger thermal conductivity along Z direction. In the above-described combination, such combined advantageous effect of the heat spread effect by the first layer and the higher thermal conductivity to Z direction by the second layer achieves reduced thermal resistance of the entire semiconductor device.

According to yet other aspect of the present invention, there is provided a semiconductor device, comprising: a semiconductor element having a rectangular two-dimensional geometry and serving as a heat source; a first heat sink section having the semiconductor element mounted thereon; and a second heat sink section joined to the opposite side of the first heat sink section having the semiconductor element, wherein a relation among directional components of thermal conductivity of the first heat sink section is $K1yy \geqq K1xx > K1zz$, where the longer side direction of the semiconductor element is defined as X direction, the shorter side direction thereof is defined as Y direction and the thickness direction is defined as Z direction and the directional components of the thermal conductivity of the first heat sink section in X, Y and X directions are determined as $K1xx$, $K1yy$ and $K1zz$, and wherein the second heat sink section is composed of a material having isotropic thermal conductivity of equal to or higher than 300 W/mK.

In the above-described aspect of the present invention, the semiconductor device may include metallic layers in the side of a surface thereof having the semiconductor element of the heat sink section mounted thereon.

In the above-described aspect of the present invention, a bonding layer may be included in an interface between the metallic layer and the heat sink section.

In the above-described aspect of the present invention, a plurality of the semiconductor elements may be included, and the semiconductor elements may be aligned in series along the longer side direction of the semiconductor element.

In the above-described aspect of the present invention, at least two directional components of the thermal conductivity of the heat sink section in X, Y and Z directions may be equal to or higher than 600 W/mK, the heat sink section having anisotropic thermal conductivity.

This allows obtaining larger heat spread effect in the first heat sink section.

Further, the reduced thickness of the first heat sink section allows an inhibition for the increase in the thermal resistance.

In the above-described combination, such combined advantageous effect of the heat spread effect by the first layer and the heat sink section exhibiting higher thermal conductivity in the second layer achieves reduced thermal resistance of the entire semiconductor device.

Advantage of the Invention

According to the present invention, a semiconductor device having enhanced heat-release ability and improved reliability can be achieved by defining three-dimensional relative directions of the semiconductor element having a rectangular two-dimensional geometry and serving as a heat source with the heat sink.

BRIEF DESCRIPTION OF THE DRAWINGS

The above-described and other objects, features and advantages of the present invention will be more apparent from the following description of certain preferred embodiments taken in conbonding with the accompanying drawings, in which.

BEST MODE FOR CARRYING OUT THE INVENTION

Preferable embodiments according the present invention will be described in reference to annexed figures. In all figures, an identical numeral is assigned to an element commonly appeared in the figures, and the detailed description thereof will not be repeated. In the following descriptions, longer side (short side) direction means longitudinal (transverse) direction.

First Embodiment

Figure 1:
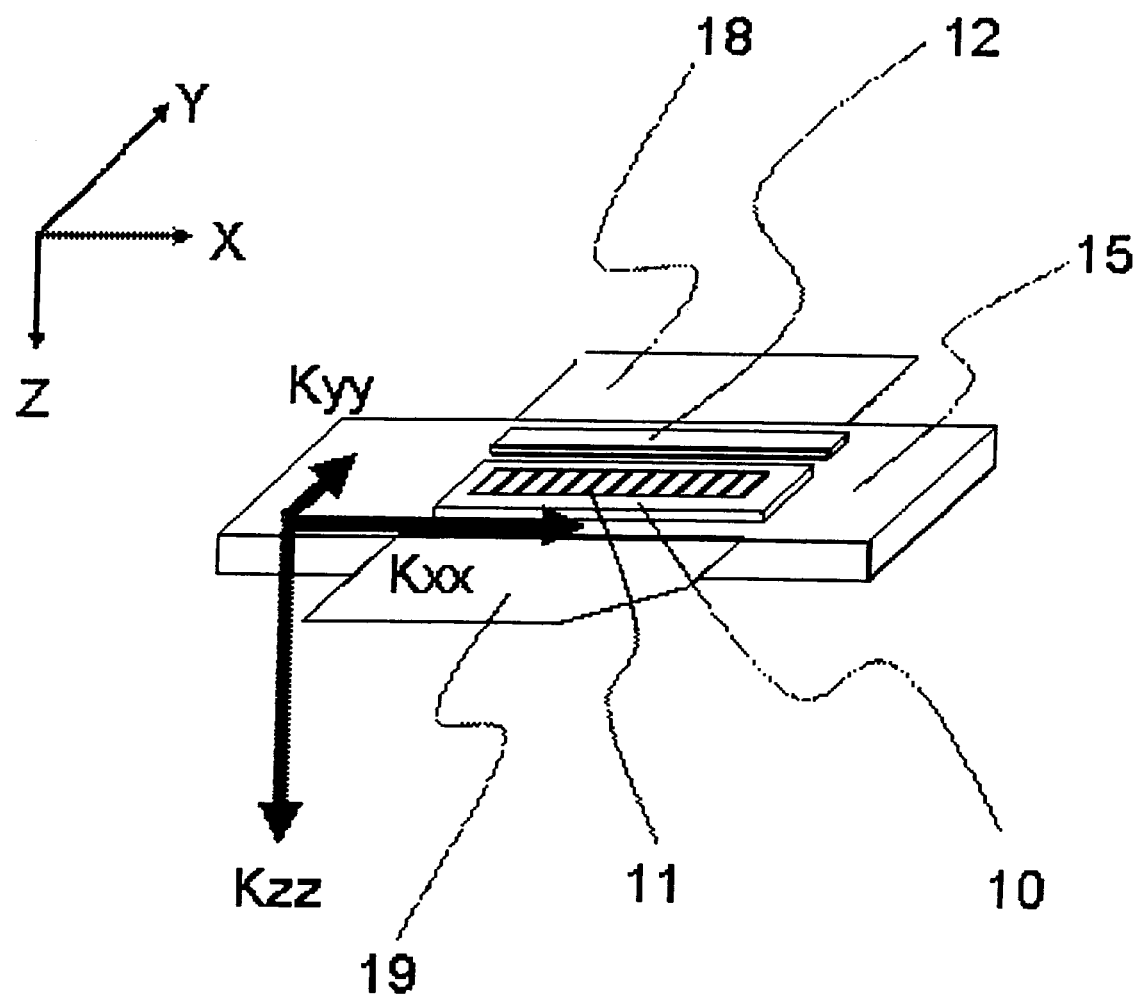
FIG. 1 is a schematic perspective view, illustrating a semiconductor device including a semiconductor element having a rectangular two-dimensional geometry and serving as a heat source, which is mounted on a package including a heat sink according to first embodiment of the present invention.
Figure 2:
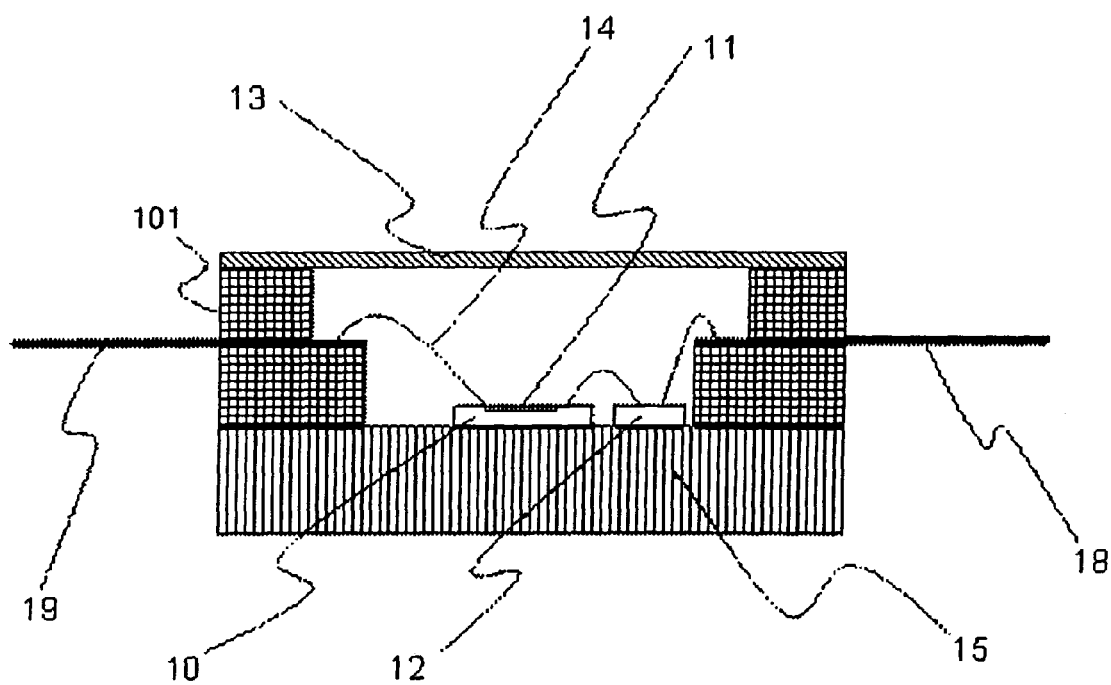
FIG. 2 is a cross-sectional view, illustrating a semiconductor device including a semiconductor element having a rectangular two-dimensional geometry and serving as a heat source, which is mounted on a package including a heat sink according to first embodiment of the present invention.
Figure 3:
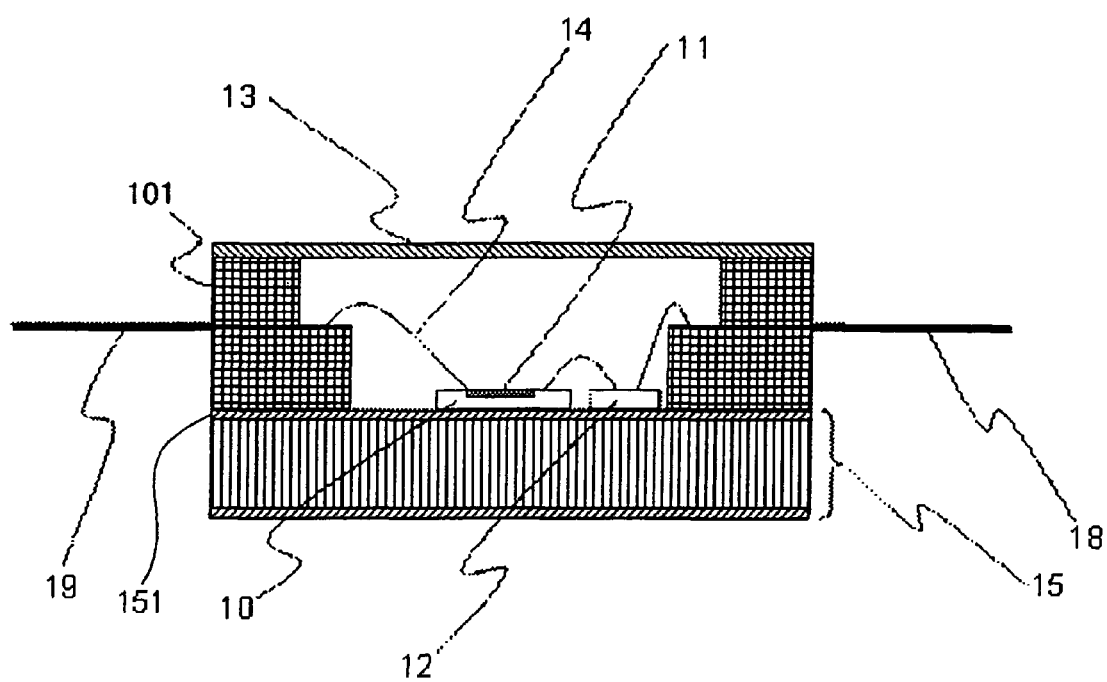
FIG. 3 is a cross-sectional view, illustrating a semiconductor device including a semiconductor element having a rectangular two-dimensional geometry and serving as a heat source, which is mounted on a package including a heat sink according to first embodiment of the present invention.

FIG. 1 is a schematic perspective view of a semiconductor device illustrating first embodiment of the present invention, and FIG. 2 and FIG. 3 are schematic cross-sectional views of semiconductor elements having rectangular two-dimensional geometry in a central section of the semiconductor element, along Y direction, which is equivalent to the short side direction. The details of the respective materials are not presented in the figures, and only sections necessary for describing the feature of the present invention are extracted to be illustrated. In FIG. 1 to FIG. 3, 10 indicates a semiconductor element, 11 indicates a region for heat generated by the semiconductor element, 12 indicates a matching circuit substrate, 13 indicates a lid of a package, 14 indicates a gold wire, and 15 indicates a heat sink section. The semiconductor element 10 has a rectangular two-dimensional geometry, and serves as a heat source. Further, in FIG. 3, copper (Cu) thin layers 151 (metallic layer) made of a metal such as, for example Cu, and having a thickness 40 to 60 µm, are firmly adhered onto a front surface and a back surface of a composite material serving as the heat sink section 15 by utilizing a bonding layer composed of a metal to provide a sandwich structure. The bonding layer functions to join the interface between the Cu thin layer 151 and the heat sink. In addition to above, since the bonding layer is thinner, the presence of such bonding layer is not shown in the drawings. This allows providing a planarization of a rough front surface of the heat sink section 15 to achieve the surface finish of the metallic material. In addition to above, the thickness of such Cu thin layer 151 is preferably equal to or lower than 100 µm, and more preferably equal to or lower than 75 µm. This provides further reducing the temperature rise. In addition, in both configurations shown in FIG. 2 and FIG. 3, gold (Au) plating is made over the entire surface of the heat sink section. This allows a fusion bonding between the semiconductor element and the heat sink. In addition to above, since the configurations of the semiconductor element 10 and the matching circuit substrate 12 are similar to that in the known technology, the descriptions thereof are not present.

The directional components of the three-dimensional thermal conductivity of the above-described heat sink section in X, Y and Z directions are determined as Kxx, Kyy and Kzz in X, Y and Z directions, where the longer side direction of the semiconductor element is defined as X direction, the shorter side direction thereof is defined as Y direction and the thickness direction is defined as Z direction. Here, the heat sink section is composed of a composite material, which is formed by impregnating copper (Cu) or aluminum (Al) into a carbon fiber-reinforced carbon composite, and is disposed so as to exhibit larger thermal conductivity in X-Z plane, and on the other hand, relatively smaller thermal conductivity in Y direction, and thus the relation of $Kzz \geqq Kxx > Kyy$ or $Kxx \geqq Kzz > Kyy$ is satisfied.

The semiconductor device in the present embodiment is manufactured as follows. First of all, in a front-end process, a front surface-processing for forming electrodes or interconnects is conducted over a semiconductor device such as an FET and the like formed of a semiconductor material such as silicon (Si), gallium arsenide (GaAs), gallium nitride (GaN), silicon carbide (SiC) and the like. Subsequently, a back surface process is conducted to conduct a plated heat sink (PHS) processing over the back surface of the wafer, and an etching process is conducted, and then is diced into individual chips. This process allows obtaining the chips having the semiconductor element 10 formed therein. These front-end processing operations are similar to that in the known technology, and thus the description thereof is not presented.

Subsequently, a back-end processing is conducted to mount the manufactured chip in a package 101. The semiconductor element 10 and the matching circuit substrate 12 are fused bonded over the package having the heat sink section 15 supported on a mount device maintained at 300 degree C. via AuSn solder (containing 20% of Sn). Subsequently, an input pad electrode of the semiconductor element 10 is electrically coupled to a pad electrode of the matching circuit substrate 12, and further to an input terminal 18 of the package with the gold wire 14 by employing a wire bonding apparatus. The output side is similarly processed, and more specifically, an output electrode pad of the semiconductor element is electrically coupled to an output terminal 19 of the package with the gold wire 14. Finally, the lid 13 is disposed over the package and is encapsulated, so that the semiconductor device including the heat sink section 15 having the semiconductor element 10 mounted thereon is manufactured.

Next, advantageous effect of the semiconductor device in the present embodiment will be described.

As shown in FIG. 1, a heat generated in the active region 11 of the semiconductor element 10 is conducted to the heat sink section 15 from the semiconductor element 10. In the above-described heat sink section 15, the direction thereof for exhibiting the largest thermal conductivity is presented toward Z direction, in which a heat sink for the whole system is oriented to be a predominant factor for the thermal resistance, to accelerate the heat-releasing toward Z direction. This allows reducing the thermal resistance of the entire semiconductor device, thereby providing an improved reliability of the semiconductor element.

The thermal conductivity in the present invention may be more preferably satisfy the relation of: Kxx and $Kzz \geqq 600$ W/mK. This allows further reduction of the thermal resistance of the entire semiconductor device.

Second Embodiment

Figure 4:
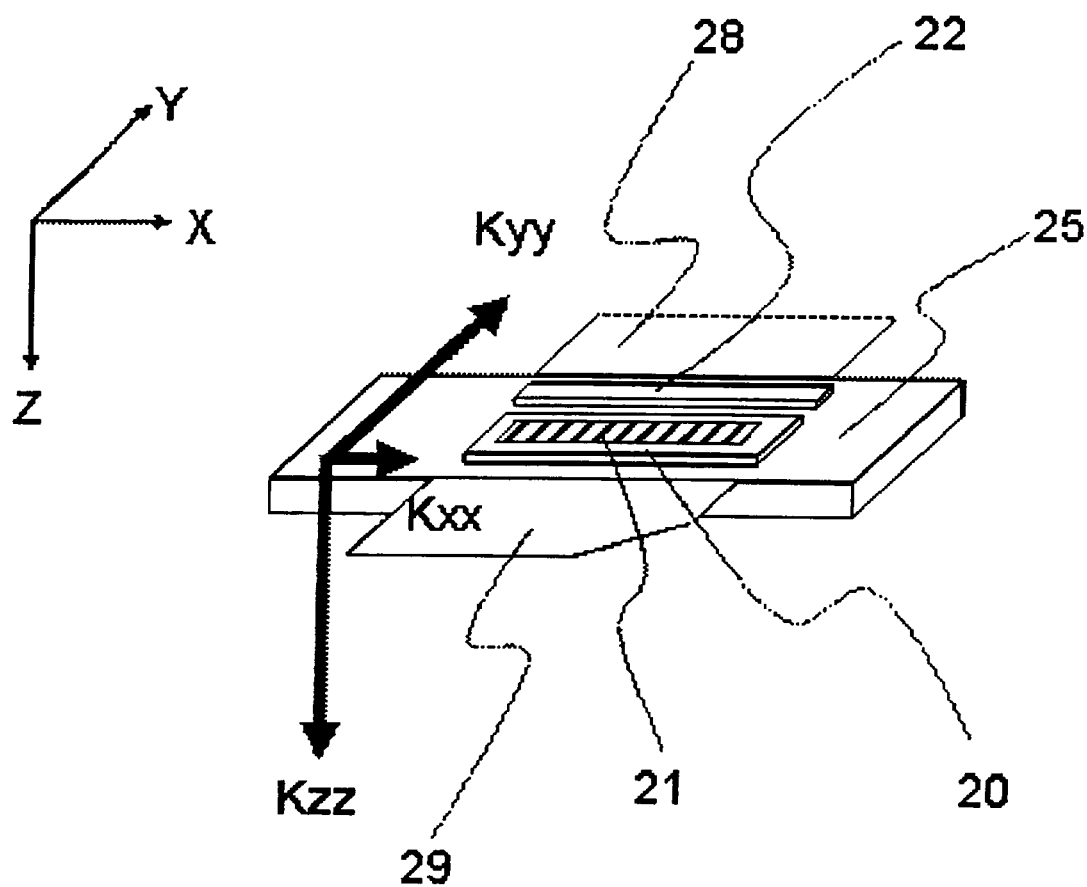
FIG. 4 is a schematic perspective view, illustrating a semiconductor device including a semiconductor element having a rectangular two-dimensional geometry and serving as a heat source, which is mounted on a package including a heat sink according to second embodiment of the present invention.
Figure 5:
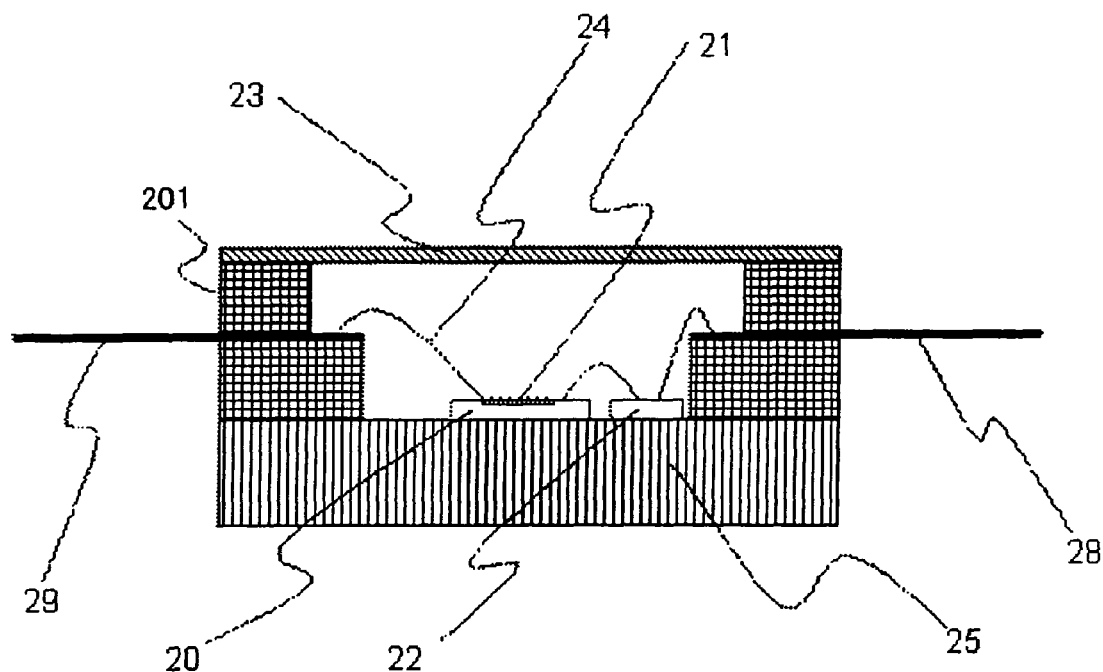
FIG. 5 is a cross-sectional view, illustrating a semiconductor device including a semiconductor element having a rectangular two-dimensional geometry and serving as a heat source, which is mounted on a package including a heat sink according to second embodiment of the present invention.
Figure 6:
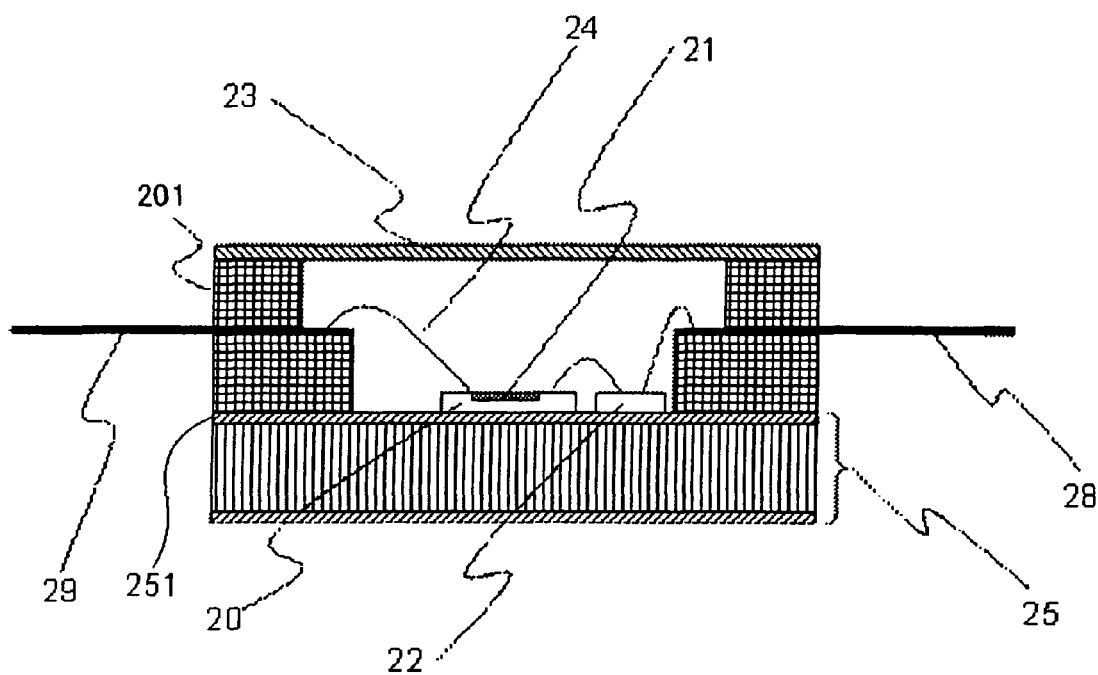
FIG. 6 is a cross-sectional view, illustrating a semiconductor device including a semiconductor element having a rectangular two-dimensional geometry and serving as a heat source, which is mounted on a package including a heat sink according to second embodiment of the present invention.

FIG. 4 is a schematic perspective view of a semiconductor device illustrating second embodiment of the present invention, and FIG. 5 and FIG. 6 are schematic cross-sectional views of semiconductor elements having rectangular two-dimensional geometry in a central section of the semiconductor element, along Y direction, which is equivalent to the short side direction. The details of the respective materials are not presented in the figures, and only sections necessary for describing the feature of the present invention are extracted to be illustrated. In FIG. 4 to FIG. 6, 20 indicates a semiconductor element, 21 indicates a region for heat generated by the semiconductor element, 22 indicates a matching circuit substrate, 23 indicates a lid of a package, 24 indicates a gold wire, and 25 indicates a heat sink section. The semiconductor element 20 has a rectangular two-dimensional geometry, and serves as a heat source. Further, in FIG. 6, copper (Cu) thin layers 251 (metallic layer) made of a metal such as, for example Cu, and having a thickness 40 to 60 μm, are firmly adhered onto a front surface and a back surface of a composite material serving as the heat sink section 25 by utilizing a bonding layer composed of a metal to provide a sandwich structure. The bonding layer functions to join the interface between the Cu thin layer 251 and the heat sink. In addition to above, since the bonding layer is thinner, the presence of such bonding layer is not shown in the drawings. This allows providing a planarization of a rough front surface of the heat sink section 25 to achieve the surface finish of the metallic material. In addition to above, the thickness of such Cu thin layer 251 is preferably equal to or lower than 100 μm, and more preferably equal to or lower than 75 μm. This provides further reducing the temperature rise. In addition, in both configurations shown in FIG. 5 and FIG. 6, gold (Au) plating is made over the entire surface of the heat sink section 25. This allows a fusion between the semiconductor element and the heat sink.

In addition to above, since the configurations of the semiconductor element 20 and the matching circuit substrate 22 are similar to that in the known technology, the descriptions thereof are not present.

The directional components of the three-dimensional thermal conductivity of the above-described heat sink section 25 in X, Y and X directions are determined as Kxx, Kyy and Kzz in X, Y and Z directions, where the longer side direction of the semiconductor element 20 is defined as X direction, the shorter side direction thereof is defined as Y direction and the thickness direction is defined as Z direction. Here, the heat sink section 25 is composed of a composite material, which is formed by impregnating copper (Cu) or aluminum (Al) into a composite material composed of carbon and carbon fiber, and is disposed so as to exhibit larger thermal conductivity in Y-Z plane, and on the other hand, relatively smaller thermal conductivity in X direction, and thus the relation of Kzz≧Kyy>Kxx is satisfied. Here, concerning Kyy and Kzz, these values may be mutually replaced, and when the both values are relatively closed, equivalent effect can be obtained even if these values are replaced.

The semiconductor device in the present embodiment is manufactured as follows.

First of all, in a front-end process, a front surface-processing for forming electrodes or interconnects is conducted over a semiconductor device such as an FET and the like formed of a semiconductor material such as silicon (Si), gallium arsenide (GaAs), gallium nitride (GaN), silicon carbide (SiC) and the like. Subsequently, a back surface process is conducted to conduct a plated heat sink (PHS) processing over the back surface of the wafer, and an etching process is conducted, and then is diced into individual chips. This process allows obtaining the chips having the semiconductor element 20 formed therein. These front-end processing operations are similar to that in the known technology, and thus the description thereof is not presented.

Subsequently, a back-end processing is conducted to mount the manufactured chip in a package 201. The semiconductor element 20 and the matching circuit substrate 22 are fused bonded over the package having the heat sink section 25 supported on a mount device maintained at 300 degree C. via AuSn solder (containing 20% of Sn). Subsequently, an input pad electrode of the semiconductor element 20 is electrically coupled to a pad electrode of the matching circuit substrate 22, and further to an input terminal 28 of the package with the gold wire 24 by employing a wire bonding apparatus. The output side is similarly processed, and more specifically, an output electrode pad of the semiconductor element is electrically coupled to an output terminal 29 of the package with the gold wire 24. Finally, the lid 23 is disposed over the package and is encapsulated, so that the semiconductor device including the heat sink section 25 having the semiconductor element 20 mounted thereon is manufactured.

Next, advantageous effect of the semiconductor device in the present embodiment will be described.

As shown in FIG. 4, a heat generated in the active region 21 of the semiconductor element 20 is conducted to the heat sink section 25 from the semiconductor element 20. In the above-described heat sink section 25, the direction thereof for exhibiting the largest thermal conductivity is oriented toward Z direction, in which a heat sink for the whole system is present, to accelerate the heat-releasing toward Z direction, and the direction for exhibiting the second largest thermal conductivity is oriented toward Y direction to achieve a heat release with an improved efficiency over the wider heat-releasing region. This allows orienting the direction for exhibiting the lowest thermal conductivity toward X direction, in which the heat-release ability region is smaller. In addition, heat interference in the region for heat generation is inhibited by reducing the thermal conductivity in X direction, achieving a secondary effect of an inhibition for the temperature rise in the central section of the semiconductor element. Here, concerning Kyy and Kzz, when the both values are relatively closed, equivalent effect can be obtained even if these values are replaced.

The above-described advantageous effect allows reducing the thermal resistance of the entire semiconductor device, thereby providing an improved reliability of the semiconductor element.

The thermal conductivity in the present invention may be more preferably satisfy the relation of: Kzz and Kyy≧600 W/mK. This allows further reduction of the thermal resistance of the entire semiconductor device.

Third Embodiment

Figure 7:
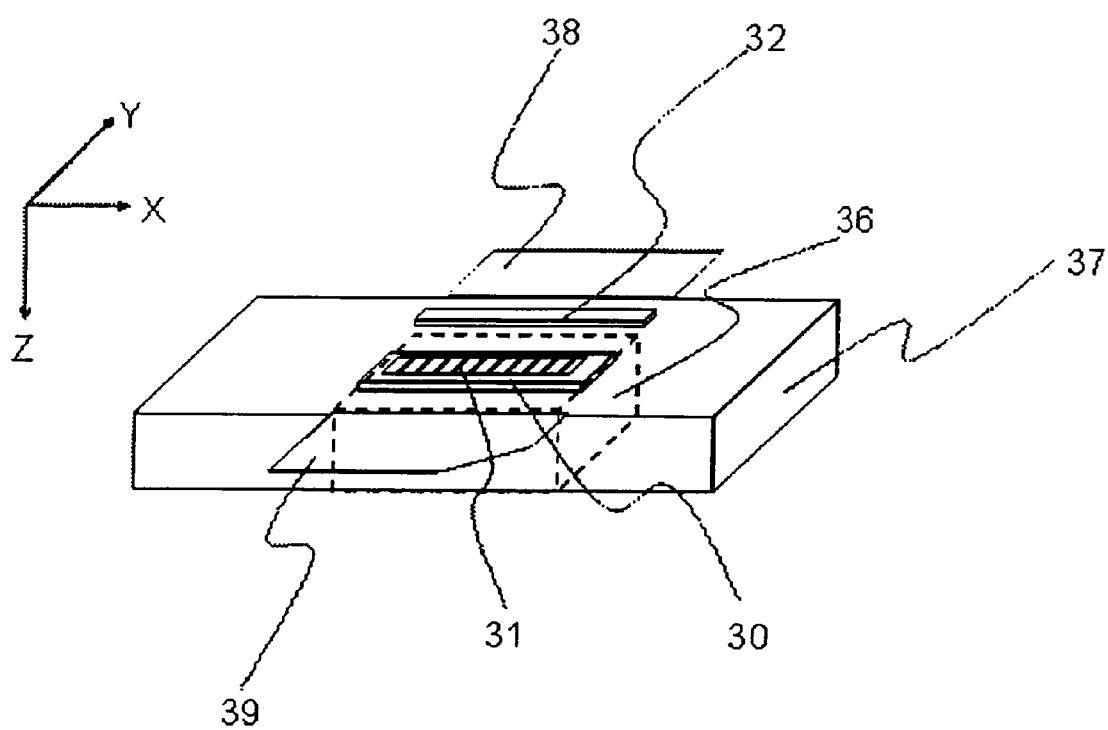
FIG. 7 is a schematic perspective view, illustrating a semiconductor device including a semiconductor element having a rectangular two-dimensional geometry and serving as a heat source, which is mounted on a package including a heat sink according to third embodiment of the present invention.
Figure 8:
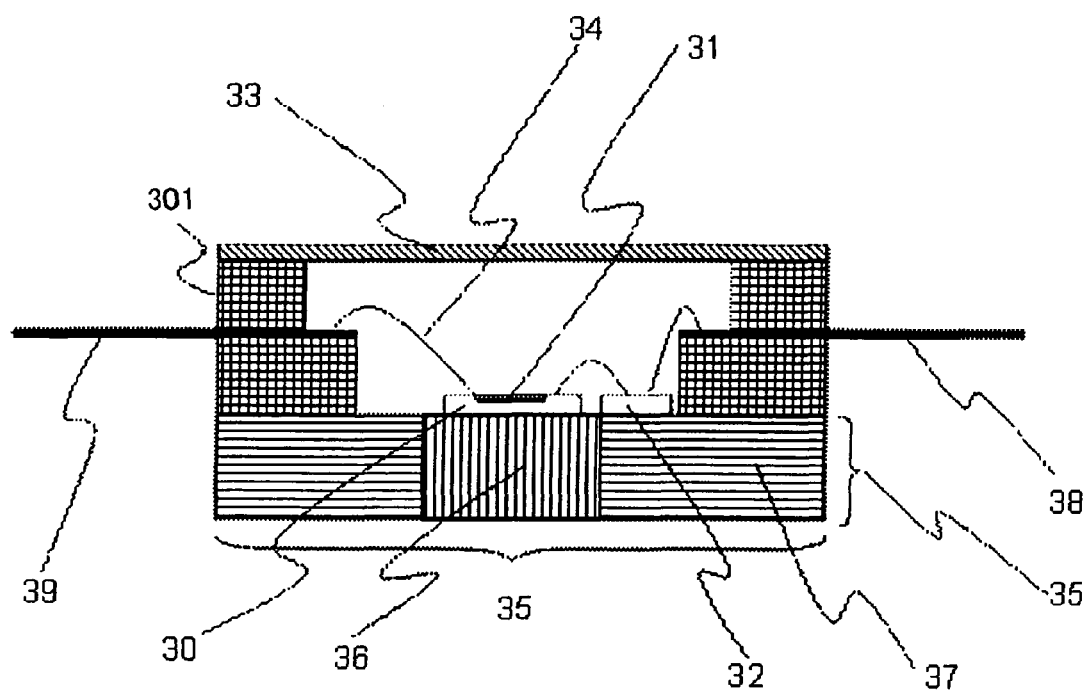
FIG. 8 is a cross-sectional view, illustrating a semiconductor device including a semiconductor element having a rectangular two-dimensional geometry and serving as a heat source, which is mounted on a package including a heat sink according to third embodiment of the present invention.
Figure 9:
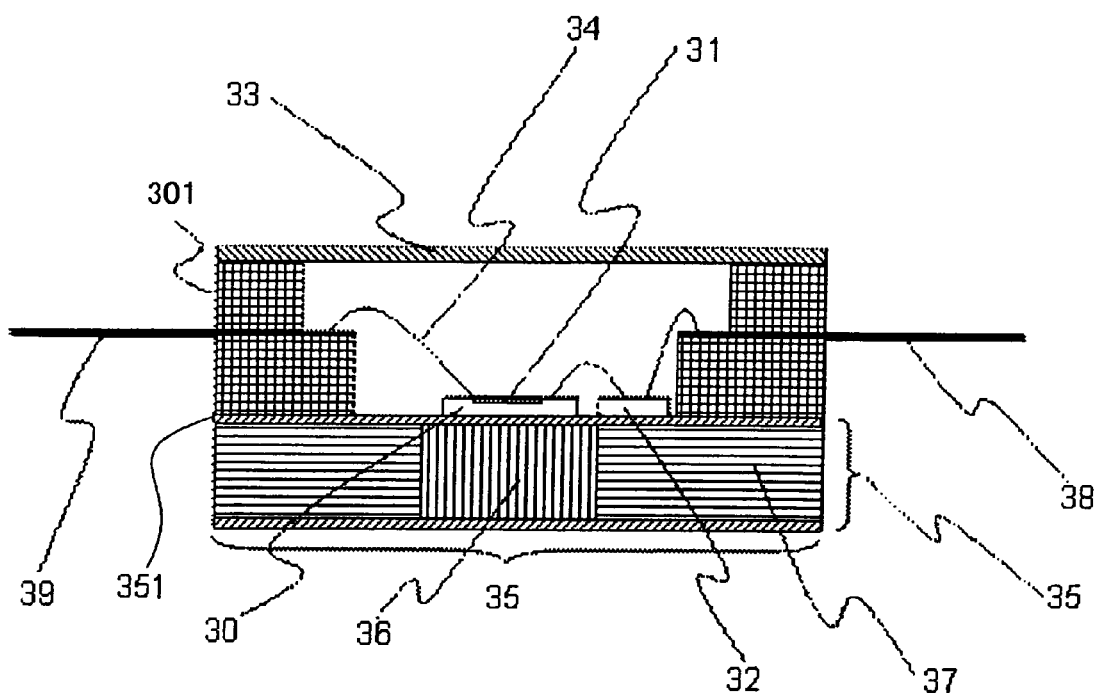
FIG. 9 is a cross-sectional view, illustrating a semiconductor device including a semiconductor element having a rectangular two-dimensional geometry and serving as a heat source, which is mounted on a package including a heat sink according to third embodiment of the present invention.

FIG. 7 is a schematic perspective view of a semiconductor device illustrating third embodiment of the present invention, and FIG. 8 and FIG. 9 are schematic cross-sectional views of semiconductor elements having rectangular two-dimensional geometry, along Y direction, which is equivalent to the short side direction.

The details of the respective materials are not presented in the figures, and only sections necessary for describing the feature of the present invention are extracted to be illustrated. In FIG. 7 to FIG. 9, 30 indicates a semiconductor element, 31 indicates a region for heat generated by the semiconductor element, 32 indicates a matching circuit substrate, 33 indicates a lid of a package, 34 indicates a gold wire, 35 indicates a first heat sink section, and 36 indicates a second heat sink section. The first heat sink section 36 is provided right under the heat source, and the second heat sink section 37 is provided around the above-described first heat sink 36. The semiconductor element 30 has a rectangular two-dimensional geometry, and serves as a heat source.

Further, in FIG. 9, copper (Cu) thin layers 351 (metallic layer) made of a metal such as, for example Cu, and having a thickness 40 to 60 μm, are firmly adhered onto a front surface and a back surface of a composite material serving as the heat sink section 35 by utilizing a bonding layer composed of a metal to provide a sandwich structure. The bonding layer functions to join the interface between the Cu thin layer 351 and the heat sink. In addition to above, since the bonding layer is thinner, the presence of such bonding layer is not shown in the drawings. This allows providing a planarization of a rough front surface of the heat sink section 35 to achieve the surface finish of the metallic material. In addition to above, the thickness of such Cu thin layer 351 is preferably equal to or lower than 100 µm, and more preferably equal to or lower than 75 µm. This provides further reducing the temperature rise. In addition, in both configurations shown in FIG. 7 and FIG. 8, gold (Au) plating is made over the entire surface of the heat sink sections. This allows a fusion bonding between the semiconductor element and the heat sink.

In addition to above, since the configurations of the semiconductor element 30 and the matching circuit substrate 32 are similar to that in the known technology, the descriptions thereof are not present.

The directional components of the three-dimensional thermal conductivity of the above-described first and the second heat sink sections 36 and 37 are determined as $K1xx$, $K1yy$ and $K1zz$, and $K2xx$, $K2yy$ and $K2zz$ in X, Y and Z directions, where the longer side direction of the semiconductor element 30 is defined as X direction, the shorter side direction thereof is defined as Y direction and the thickness direction is defined as Z direction. Here, the first heat sink section 36 is composed of a composite material, which is formed by impregnating Cu or Al into a carbon fiber-reinforced carbon composite, and is disposed so as to exhibit larger thermal conductivity in Y-Z plane, and on the other hand, relatively smaller thermal conductivity in X direction, and thus the relation of $Kzz \geq Kyy > Kxx$ or $K1yy \geq K1zz > K1xx$ is satisfied. On the other hand, the second heat sink section 37 is composed of a composite material, which is formed by impregnating Cu or Al into a carbon fiber-reinforced carbon composite, and is disposed so as to exhibit larger thermal conductivity in X-Y plane, and on the other hand, relatively smaller thermal conductivity in Z direction, and thus the relation of $Kyy \geq Kxx > Kzz$ is satisfied.

The semiconductor device in the present embodiment is manufactured as follows.

First of all, in a front-end process, a front surface-processing for forming electrodes or interconnects is conducted over a semiconductor device such as an FET and the like formed of a semiconductor material such as Si, GaAs, GaN, SiC and the like. Subsequently, a back surface process is conducted to conduct a PHS processing over the back surface of the wafer, and an etching process is conducted, and then is diced into individual chips. This process allows obtaining the chips having the semiconductor element 30 formed therein. These front-end processing operations are similar to that in the known technology, and thus the description thereof is not presented.

Subsequently, a back-end processing is conducted to mount the manufactured chip in a package 301. The semiconductor element 30 and the matching circuit substrate 32 are fused bonded over the package having the heat sink section 35 supported on a mount device maintained at 300 degree C. via AuSn solder (containing 20% of Sn). In such case, the semiconductor element 30 is mounted so as to be mounted immediately above the heat sink section 36. Subsequently, an input pad electrode of the semiconductor element 30 is electrically coupled to a pad electrode of the matching circuit substrate 32, and further to an input terminal 38 of the package with the gold wire 34 by employing a wire bonding apparatus. The output side is similarly processed, and more specifically, an output electrode pad of the semiconductor element is electrically coupled to an output terminal 39 of the package with the gold wire 34. Finally, the lid 33 is disposed over the package and is encapsulated, so that the semiconductor device including the heat sink section 35 having the semiconductor element 30 mounted thereon is manufactured.

Next, advantageous effect of the semiconductor device in the present embodiment will be described.

As shown in FIG. 7, a heat generated in the active region 31 of the semiconductor element 20 is conducted to the heat sink sections 36 and 37 from the semiconductor element 30, and the direction exhibiting larger thermal conductivity of the first heat sink section 36 disposed right under the above-described semiconductor element 30 is oriented toward Y-Z plane. The directions exhibiting the larger thermal conductivity are oriented toward Z direction and Y direction, which includes larger heat-releasing region, so that effective heat release can be achieved in the region right under the semiconductor element 30. Further, the direction for exhibiting the lowest thermal conductivity is oriented toward X direction, in which the heat-release ability region is the smallest, achieving a secondary effect of reducing thermal coupling in the region for heat generation. On the other hand, in the second heat sink section 37, the direction exhibiting larger thermal conductivity is oriented toward X-Y plane, and the direction exhibiting the largest thermal conductivity is oriented toward Y direction, achieving enhanced heat release with an improved efficiency toward the larger region. Thus, in the second heat sink section 37, heat can be broadly diffused in X-Y plane.

As described above, the advantageous effects of these two heat sink sections allows obtaining enhanced heat-releasing effect as a whole semiconductor device. Thus, the thermal resistance of the entire semiconductor device can be reduced, thereby providing an improved reliability of the semiconductor element.

The semiconductor device according to the present invention may alternatively be configured that a plurality of the above-described semiconductor elements are employed, and the above-described semiconductor elements are arranged in series along the longer side direction of the above-described semiconductor element.

The thermal conductivity in the present invention may be more preferably $K1zz$ and $K1yy \geq 600$ W/mK, and $K2zz$ and $K2yy \geq 600$ W/mK.

This allows further reduction of the thermal resistance of the entire semiconductor device. As in the present invention, the cavity structure is employed in the heat sink section and a combination of the anisotropic materials having two types of the relative directions is employed to achieve enhanced heat-release ability.

Fourth Embodiment

Figure 10:
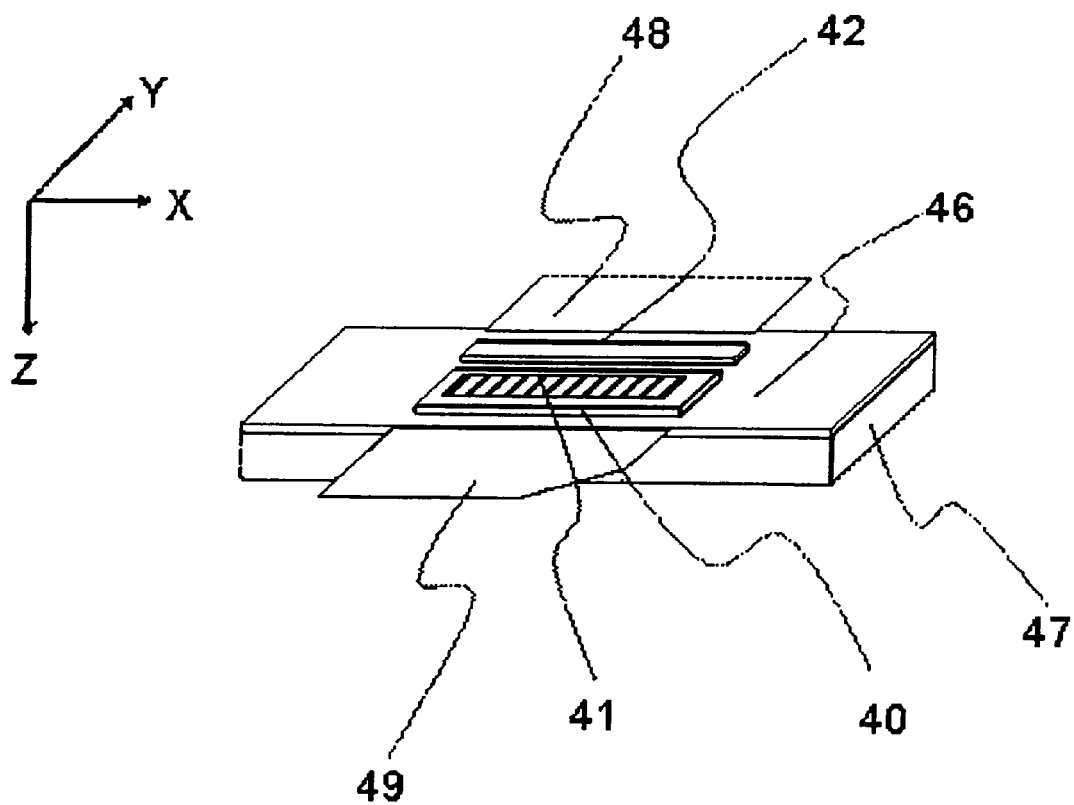
FIG. 10 is a schematic perspective view, illustrating a semiconductor device including a semiconductor element having a rectangular two-dimensional geometry and serving as a heat source, which is mounted on a package including a heat sink according to fourth embodiment of the present invention.
Figure 11:
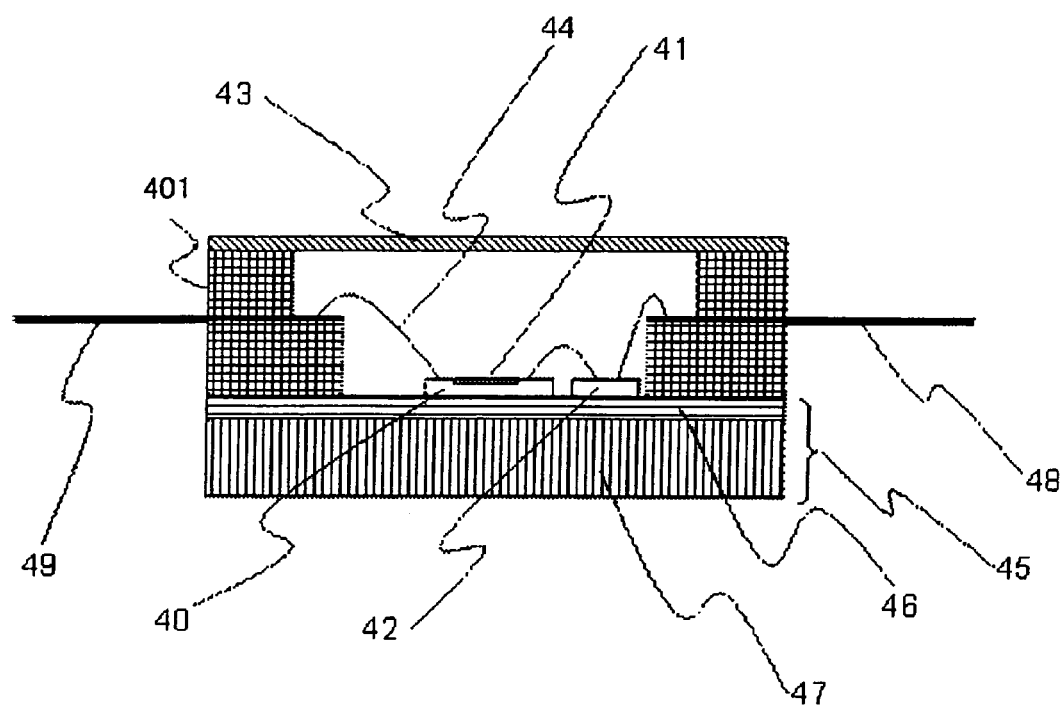
FIG. 11 is a cross-sectional view, illustrating a semiconductor device including a semiconductor element having a rectangular two-dimensional geometry and serving as a heat source, which is mounted on a package including a heat sink according to fourth embodiment of the present invention.
Figure 12:
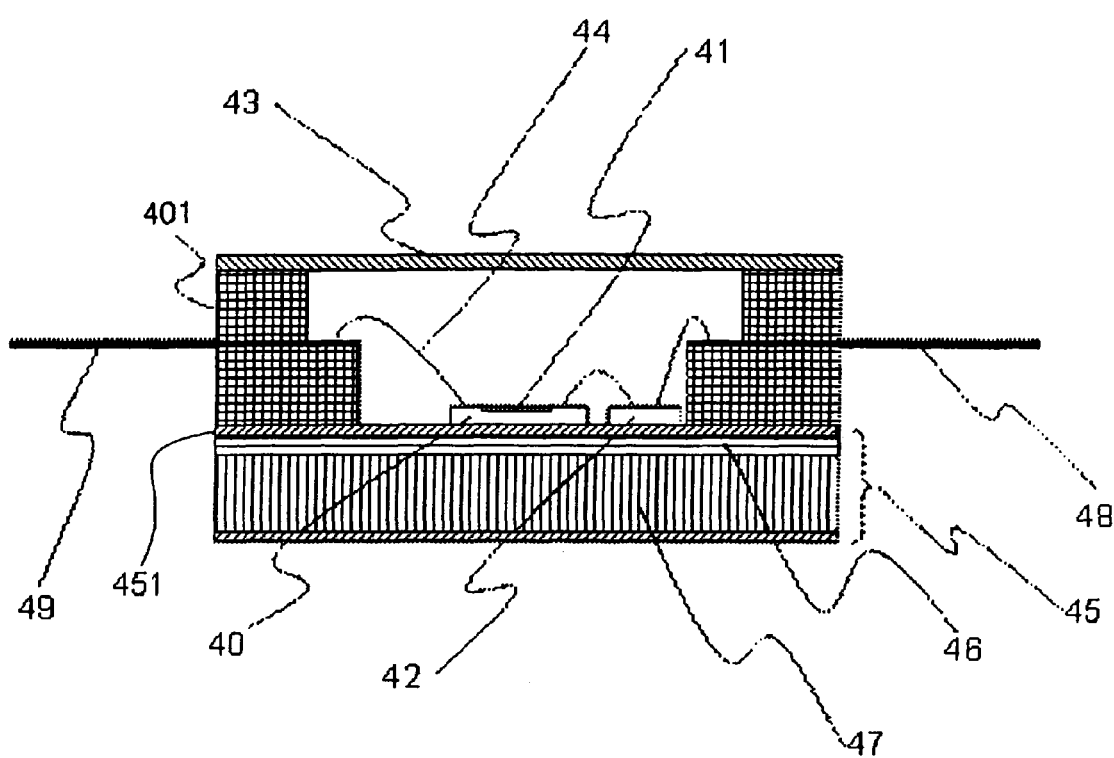
FIG. 12 is a cross-sectional view, illustrating a semiconductor device including a semiconductor element having a rectangular two-dimensional geometry and serving as a heat source, which is mounted on a package including a heat sink according to fourth embodiment of the present invention.

FIG. 10 is a schematic perspective view of a semiconductor device illustrating fourth embodiment of the present invention, and FIG. 11 and FIG. 12 are schematic cross-sectional views of semiconductor elements having rectangular two-dimensional geometry in a central section of the semiconductor element, along Y direction, which is equivalent to the short side direction. The details of the respective materials are not presented in the figures, and only sections necessary for describing the feature of the present invention are extracted to be illustrated. In FIG. 10 to FIG. 12, 40 indicates a semiconductor element, 41 indicates a region for heat generated by the semiconductor element, 42 indicates a matching circuit substrate, 43 indicates a lid of a package, 44 indicates a gold wire, 46 indicates a first heat sink section, and 47 indicates a second heat sink section. The second heat sink section 47 is joined to the opposite side of the first heat sink section 46 having the semiconductor element. The semiconductor element 40 has a rectangular two-dimensional geometry, and serves as a heat source. Further, in FIG. 12, Cu thin layers 451 (metallic layer) made of a metal such as, for example Cu, and having a thickness 40 to 60 µm, are firmly adhered onto a front surface and a back surface of a composite material serving as the heat sink section 45 by utilizing a bonding layer composed of a metal to provide a sandwich structure. The bonding layer functions to join the interface between the Cu thin layer 451 and the heat sink. In addition to above, since the bonding layer is thinner, the presence of such bonding layer is not shown in the drawings. This allows providing a planarization of a rough front surface of the heat sink section 45 to achieve the surface finish of the metallic material. In addition to above, the thickness of such Cu thin layer 451 is preferably equal to or lower than 100 µm, and more preferably equal to or lower than 75 µm. This provides further reducing the temperature rise. In addition, in both configurations shown in FIG. 11 and FIG. 12, Au plating is made over the entire surface of the heat sink sections. This allows a fusion bonding between the semiconductor element and the heat sink.

In addition to above, since the configurations of the semiconductor element 40 and the matching circuit substrate 42 are similar to that in the known technology, the descriptions thereof are not present. The directional components of the three-dimensional thermal conductivity of the above-described first and the second heat sink sections 46 and 47 are determined as $K1xx$, $K1yy$ and $K1zz$, and $K2xx$, $K2yy$ and $K2zz$ in X, Y and Z directions, where the longer side direction of the semiconductor element 30 is defined as X direction, the shorter side direction thereof is defined as Y direction and the thickness direction is defined as Z direction.

Here, the first heat sink section 46 is composed of a composite material, which is formed by impregnating Cu or Al into a carbon fiber-reinforced carbon composite, and is disposed so as to exhibit larger thermal conductivity in X-Y plane, and on the other hand, relatively smaller thermal conductivity in Z direction, and thus the relation of $K1yy \geq K1xx > K1zz$ is satisfied. On the other hand, the second heat sink section 47 is composed of a composite material, which is formed by impregnating Cu into a carbon fiber-reinforced carbon composite, and is disposed so as to exhibit larger thermal conductivity in Y-Z plane, and on the other hand, relatively smaller thermal conductivity in X direction, and thus the relation of $K2zz \geq K2yy > K2xx$ or $K2yy \geq K2zz > K2xx$ is satisfied.

The semiconductor device in the present embodiment is manufactured as follows.

First of all, in a front-end process, a front surface-processing for forming electrodes or interconnects is conducted over a semiconductor device such as an FET and the like formed of a semiconductor material such as Si, GaAs, GaN, SiC and the like. Subsequently, a back surface process is conducted to conduct a PHS processing over the back surface of the wafer, and an etching process is conducted, and then is diced into individual chips. This process allows obtaining the chips having the semiconductor element 40 formed therein. These front-end processing operations are similar to that in the known technology, and thus the description thereof is not presented.

Subsequently, a back-end processing is conducted to mount the manufactured chip in a package 401. The semiconductor element 40 and the matching circuit substrate 42 are fused bonded over the package having the heat sink section 45 supported on a mount device maintained at 300 degree C. via AuSn solder (containing 20% of Sn). Subsequently, an input pad electrode of the semiconductor element 40 is electrically coupled to a pad electrode of the matching circuit substrate 42, and further to an input terminal 48 of the package with the gold wire 44 by employing a wire bonding apparatus. The output side is similarly processed, and more specifically, an output electrode pad of the semiconductor element is electrically coupled to an output terminal 49 of the package with the gold wire 44. Finally, the lid 43 is disposed over the package and is encapsulated, so that the semiconductor device including the heat sink section 45 having the semiconductor element 40 mounted thereon is manufactured.

Next, advantageous effect of the semiconductor device in the present embodiment will be described.

As shown in FIG. 10, a heat generated in the active region 41 of the semiconductor element 40 is conducted to the heat sink sections 46 and 47 from the semiconductor element 40, and the direction exhibiting larger thermal conductivity of the first heat sink section 46 is oriented toward X-Y plane, and the direction exhibiting the largest thermal conductivity is oriented toward Y direction, and the direction exhibiting the second largest thermal conductivity is oriented toward X direction. This allows obtaining larger heat spread effect. While the direction for exhibiting lower thermal conductivity is oriented for Z direction, the thickness of the first heat sink 46 is decreased to inhibit an increase in the thermal resistance. Next, in the second heat sink 47, the direction thereof for exhibiting the largest thermal conductivity is oriented toward Z direction, in which a heat sink for the whole system is present, to accelerate the heat-releasing toward Z direction, and the direction for exhibiting the second largest thermal conductivity is oriented toward Y direction to achieve a heat release with an improved efficiency over the wider region. This allows orienting the direction for exhibiting the lowest thermal conductivity toward X direction, in which the heat-release ability region is smaller.

In the above-described combination, such combined advantageous effect of the heat spread effect by the first layer and the higher thermal conductivity to Z direction by the second layer achieves reduced thermal resistance of the entire semiconductor device, thereby providing an improved reliability of the semiconductor element.

The semiconductor device according to the present invention may alternatively be configured that a plurality of the above-described semiconductor elements are employed, and the above-described semiconductor elements are arranged in series along the longer side direction of the above-described semiconductor element.

The thermal conductivity in the present invention may be more preferably $K1zz$ and $K1yy \geq 600$ W/mK, and $K2zz$ and $K2yy \geq 600$ W/mK.

This allows further reduction of the thermal resistance of the entire semiconductor device. In the present invention, the heat sink material of the multilayer structure consisting of three or more layers may be appropriately employed to achieve enhanced heat-release ability, in addition to the above-described heat sink of the double-layered structure.

Fifth Embodiment

Figure 13:
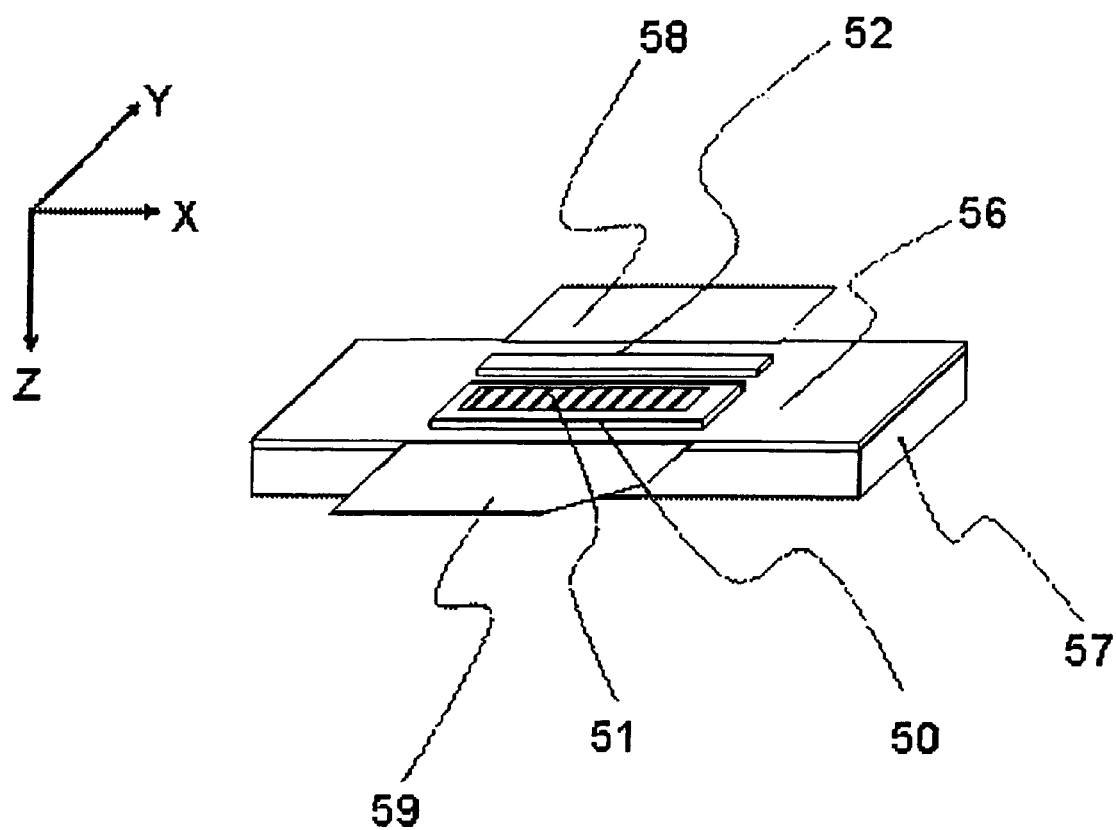
FIG. 13 is a schematic perspective view, illustrating a semiconductor device including a semiconductor element having a rectangular two-dimensional geometry and serving as a heat source, which is mounted on a package including a heat sink according to fifth embodiment of the present invention.
Figure 14:
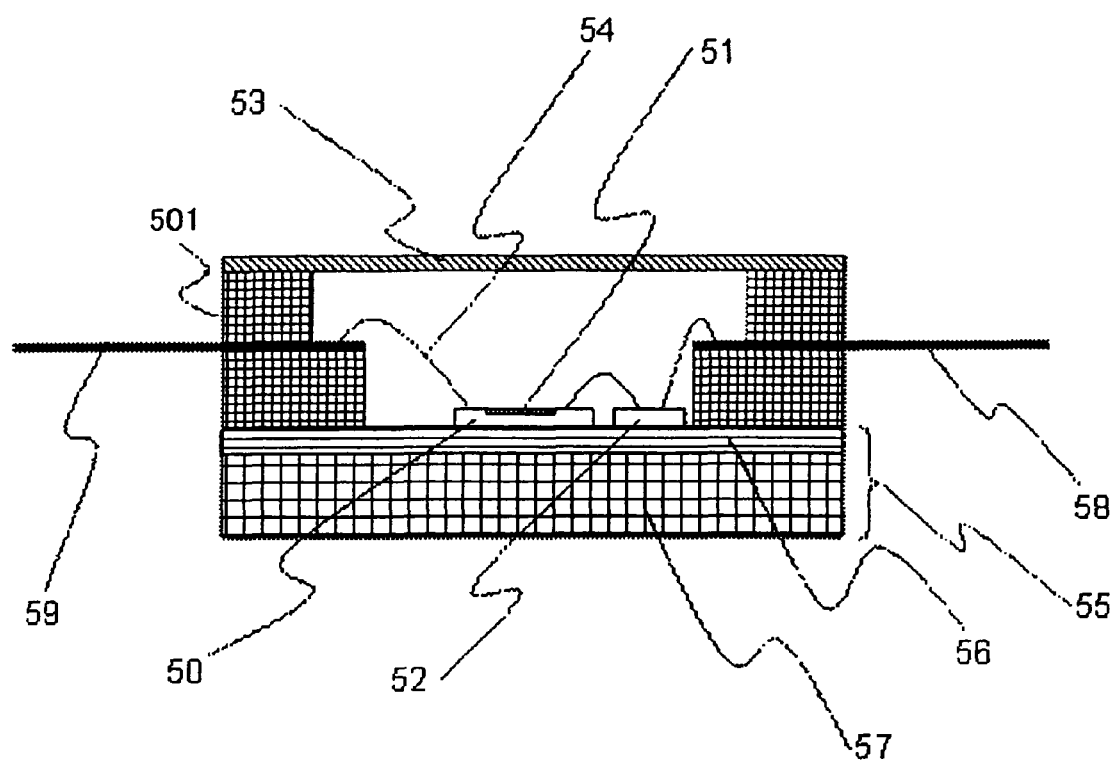
FIG. 14 is a cross-sectional view, illustrating a semiconductor device including a semiconductor element having a rectangular two-dimensional geometry and serving as a heat source, which is mounted on a package including a heat sink according to fifth embodiment of the present invention.
Figure 15:
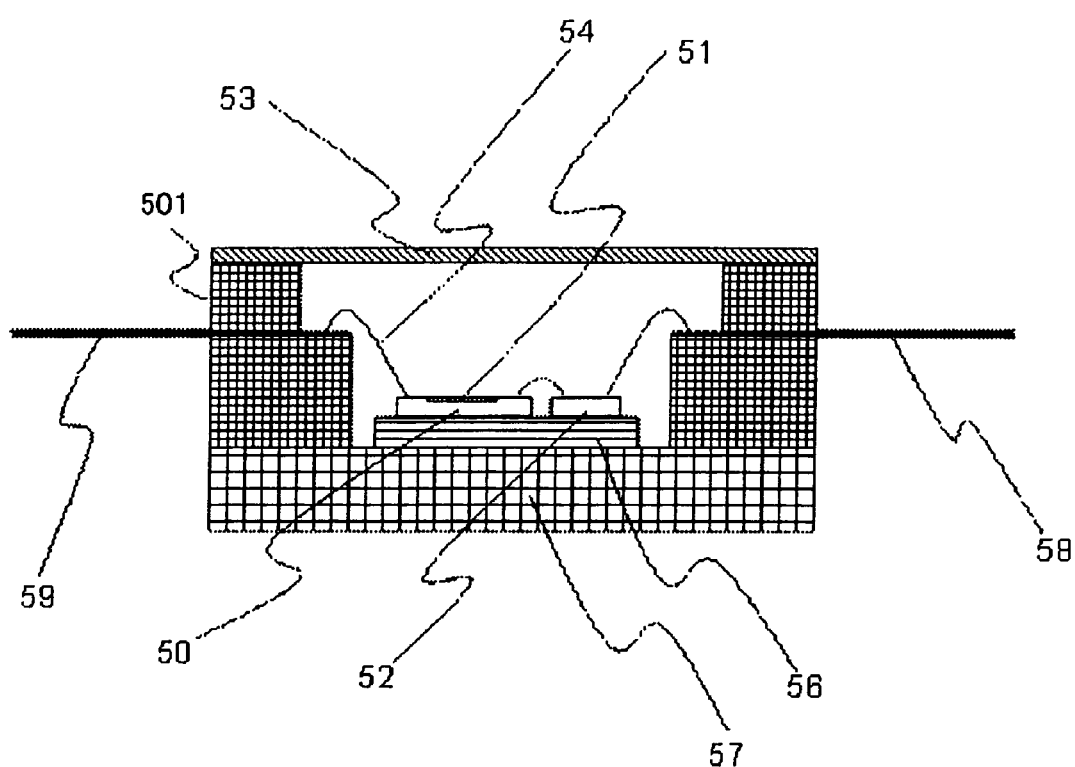
FIG. 15 is a cross-sectional view, illustrating a semiconductor device including a semiconductor element having a rectangular two-dimensional geometry and serving as a heat source, which is mounted on a package including a heat sink according to fifth embodiment of the present invention.

FIG. 13 is a schematic perspective view of a semiconductor device illustrating fifth embodiment of the present invention, and FIG. 14 and FIG. 15 are schematic cross-sectional views of semiconductor elements in a central section of the semiconductor element along Y direction, which is equivalent to the short side direction. The details of the respective materials are not presented in the figures, and only sections necessary for describing the feature of the present invention are extracted to be illustrated. In FIG. 13 to FIG. 15, 50 indicates a semiconductor element, 51 indicates a region for heat generated by the semiconductor element, 52 indicates a matching circuit substrate, 53 indicates a lid of a package, 54 indicates a gold wire, 56 indicates a first heat sink section, and 57 indicates a second heat sink section. The second heat sink section 57 is joined to the opposite side of the first heat sink section 56 having the semiconductor element. The semiconductor element 50 has a rectangular two-dimensional geometry, and serves as a heat source. In FIG. 15, the dimensional size of the first heat sink 56 in X-Y plane is presented to meet a dimensional size, in which the semiconductor element 50 and the matching circuit substrate 52 can be mounted (so-called sub mount structure). In addition to above, since the configurations of the semiconductor element 50 and the matching circuit substrate 52 are similar to that in the known technology, the descriptions thereof are not present.

The directional components of the three-dimensional thermal conductivity of the above-described first and the second heat sink sections 56 and 57 are determined as $K1xx$, $K1yy$ and $K1zz$, and $K2$ in X, Y and Z directions, where the longer side direction of the semiconductor element 30 is defined as X direction, the shorter side direction thereof is defined as Y direction and the thickness direction is defined as Z direction. Here, the first heat sink section 56 is composed of a composite material, which is formed by impregnating Cu or Al into a carbon fiber-reinforced carbon composite, and is disposed so as to exhibit larger thermal conductivity in X-Y plane, and on the other hand, relatively smaller thermal conductivity in Z direction, and thus the relation of $K1yy \geqq K1xx > K1zz$ is satisfied. On the other hand, the second heat sink 57 is composed of an isotropic material having a thermal conductivity $K2$ of equal to or higher than 300 W/mK, typically as, for example a metallic material such as silver (Ag), Cu, Au and the like, or diamond. Other type of material may be employed if the material exhibits such isotropic thermal conductivity.

The semiconductor device in the present embodiment is manufactured as follows.

First of all, in a front-end process, a front surface-processing for forming electrodes or interconnects is conducted over a semiconductor device such as an FET and the like formed of a semiconductor material such as Si, GaAs, GaN, SiC and the like. Subsequently, a back surface process is conducted to conduct a PHS processing over the back surface of the wafer, and an etching process is conducted, and then is diced into individual chips. This process allows obtaining the chips having the semiconductor element 50 formed therein. These front-end processing operations are similar to that in the known technology, and thus the description thereof is not presented.

Subsequently, a back-end processing is conducted to mount the manufactured chip in a package 501. The semiconductor element 50 and the matching circuit substrate 52 are fused bonded over the package having the heat sink section 55 supported on a mount device maintained at 300 degree C. via AuSn solder (containing 20% of Sn). Subsequently, an input pad electrode of the semiconductor element 50 is electrically coupled to a pad electrode of the matching circuit substrate 52, and further to an input terminal 58 of the package with the gold wire 54 by employing a wire bonding apparatus. The output side is similarly processed, and more specifically, an output electrode pad of the semiconductor element is electrically coupled to an output terminal 59 of the package with the gold wire 54. Finally, the lid 53 is disposed over the package and is encapsulated, so that the semiconductor device including the heat sink section 55 having the semiconductor element 50 mounted thereon is manufactured.

Next, advantageous effect of the semiconductor device in the present embodiment will be described.

As shown in FIG. 13, a heat generated in the active region 51 of the semiconductor element 50 is conducted to the heat sink sections 56 and 57 from the semiconductor element 50, and the direction exhibiting larger thermal conductivity of the first heat sink section 56 is oriented toward X-Y plane, and the direction exhibiting the largest thermal conductivity is oriented toward Y direction, and the direction exhibiting the second largest thermal conductivity is oriented toward X direction. This allows obtaining larger heat spread effect. While the direction for exhibiting lower thermal conductivity is oriented for Z direction, the thickness of the first heat sink 56 is decreased to inhibit an increase in the thermal resistance. Next, a metallic material or diamond having isotropic thermal conductivity $K2$ of equal to or higher than 300 W/mK is employed for the second heat sink 57.

In the above-described combination of the two layers, such combined advantageous effect of the heat spread effect by the first heat sink 56 and the higher thermal conductivity to Z direction of equal to or higher than 300 W/mK by the second heat sink 57 achieves reduced thermal resistance of the entire semiconductor device, thereby providing an improved reliability of the semiconductor element.

The semiconductor device according to the present invention may alternatively be configured that a plurality of the above-described semiconductor elements are employed, and the above-described semiconductor elements are arranged in series along the longer side direction of the above-described semiconductor element.

The thermal conductivity in the present invention may be more preferably $K1zz$ and $K1yy \geqq 600$ W/mK. This allows further reduction of the thermal resistance of the entire semiconductor device.

Sixth Embodiment

Figure 16:
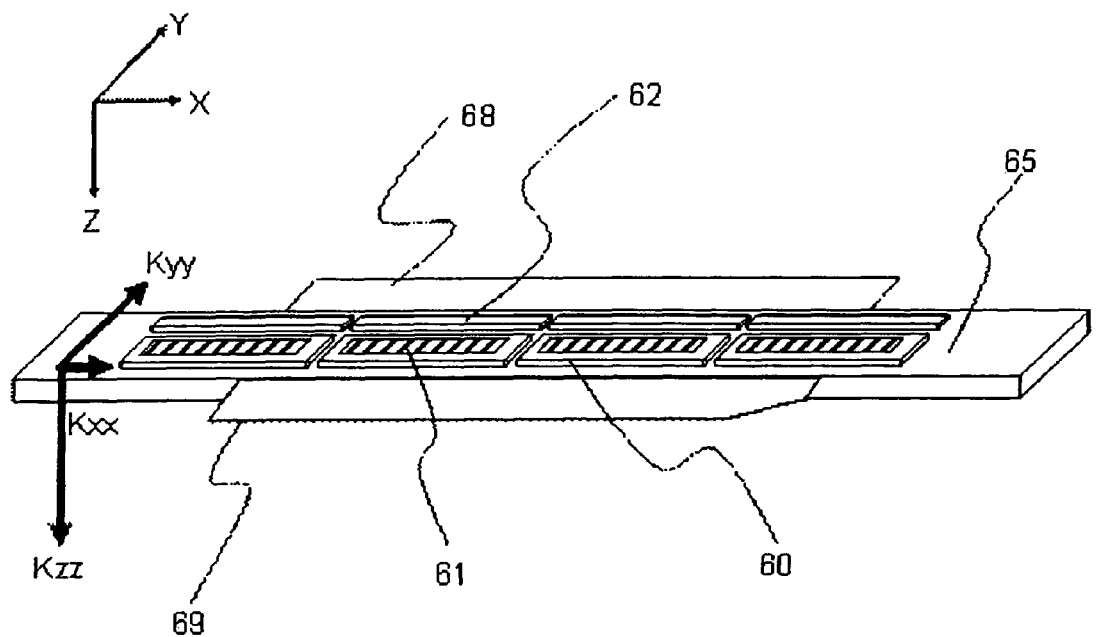
FIG. 16 is a schematic perspective view, illustrating a semiconductor device including a semiconductor element having a rectangular two-dimensional geometry and serving as a heat source, which is mounted on a package including a heat sink according to sixth embodiment of the present invention.

FIG. 16 is a schematic perspective view of a semiconductor device, illustrating sixth embodiment of the present invention. The details of the respective materials are not presented in the figures, and only sections necessary for describing the feature of the present invention are extracted to be illustrated. In FIG. 16, 60 indicates semiconductor elements, 61 indicates regions for heat generated by the semiconductor element, 62 indicates matching circuit substrates, four of which are arranged, and 65 indicates a heat sink. The semiconductor elements 60 have a rectangular two-dimensional geometry, and serves as a heat source. All of the semiconductor elements 60 are aligned in series along the longer side direction. More specifically, the respective longer sides of the semiconductor elements 60 are generally collinearly aligned. In addition to above, since the configurations of the semiconductor element 60 and the matching circuit substrate 62 are similar to that in the known technology, the descriptions thereof are not present. The directional components of the three-dimensional thermal conductivity of the above-described heat sink section 65 in X, Y and Z directions are determined as Kxx, Kyy and Kzz in X, Y and Z directions, where the longer side direction of the semiconductor element 60 is defined as X direction, the shorter side direction thereof is defined as Y direction and the thickness direction is defined as Z direction. Here, the heat sink section 65 is composed of a composite material, which is formed by impregnating Cu or Al into a carbon fiber-reinforced carbon composite, and is disposed so as to exhibit larger thermal conductivity in Y-Z plane, and on the other hand, relatively smaller thermal conductivity in X direction, and thus the relation of $Kzz \geqq Kyy > Kxx$ is satisfied. Here, concerning Kyy and Kzz, when the both values are relatively closed, equivalent effect can be obtained even if these values are replaced.

The semiconductor device in the present embodiment is manufactured as follows.

First of all, in a front-end process, a front surface-processing for forming electrodes or interconnects is conducted over a semiconductor device such as an FET and the like formed of a semiconductor material such as Si, GaAs, GaN, SiC and the like. Subsequently, a back surface process is conducted to conduct a PHS processing over the back surface of the wafer, and an etching process is conducted, and then is diced into individual chips. This process allows obtaining the chips having the semiconductor elements 60 formed therein. These front-end processing operations are similar to that in the known technology, and thus the description thereof is not presented.

Subsequently, a back-end processing is conducted to mount the manufactured chip in a package. The semiconductor elements 60 and the matching circuit substrates 62 are fused bonded over the package having the heat sink section 65 supported on a mount device maintained at 300 degree C. via AuSn solder (containing 20% of Sn). In this occasion, a plurality of semiconductor elements 60 are aligned in series along the longer side direction of the semiconductor elements 60. Subsequently, input pad electrodes of the semiconductor elements 60 are electrically coupled to pad electrodes of the matching circuit substrates 62, and further to an input terminal 68 of the package with the gold wire by employing a wire bonding apparatus. The output side is similarly processed, and more specifically, the output electrode pads of the semiconductor elements are electrically coupled to the output terminals 69 of the package with the gold wire. Finally, the lid 63 is disposed over the package and is encapsulated, so that the semiconductor device including the heat sink section 65 having the semiconductor elements 60 mounted thereon is manufactured.

Next, advantageous effect of the semiconductor device in the present embodiment will be described.

As shown in FIG. 16, a heat generated in the active region 61 of the semiconductor element 60 is conducted to the heat sink section 65 from the semiconductor element 60, and the direction exhibiting the largest thermal conductivity of the above-described heat sink section 65 is oriented toward Z direction, in which a heat sink for the whole system is oriented to be a predominant factor for the thermal resistance, to enhance the heat release, and the direction exhibiting the second largest thermal conductivity is oriented toward Y direction to achieve a heat release with an improved efficiency over the wider region. This allows orienting the direction for exhibiting the lowest thermal conductivity toward X direction, in which the heat-release ability region is smaller. In addition, heat interference in the region for heat generation is inhibited by reducing the thermal conductivity in X direction, achieving an effect of an inhibition for the temperature rise in the central section of the semiconductor element 60. The configuration of the present embodiment containing aligned chips allows inhibiting the thermal coupling between the chips, achieving an effect of an inhibition for the temperature rise in the semiconductor element located in the central section among four semiconductor elements 60.

As described above, the above-described advantageous effect allows reducing the thermal resistance of the entire semiconductor device, thereby providing an improved reliability of the semiconductor element.

Concerning the quantity of the available semiconductor elements, the configuration of the present invention is not limited to be adopted for one chip application in the high-power amplifier. For example, a plurality of FETs are arranged in parallel, and two-chip configuration or four-chip configuration as described in the present embodiment may be employed, where the quantity of the semiconductor elements is two or four, respectively. In general, multiple-chip configuration may be employed to achieve higher power in the high-power amplifier.

While the configuration of the single-layered structure described in the first and the second embodiments have been illustrated as the structure of the heat sink section in the present embodiment, other configurations such as, for example, a configuration provided with a first heat sink section right under the heat source and a second heat sink section around the above-described first heat sink as described in third embodiment, may be employed. Alternatively, a double-layered structure described in fourth and fifth embodiments may be employed. Alternatively, a metallic layer of Cu or the like may be formed in at least a front surface or a back surface of the heat sink section.

The thermal conductivity in the present invention may be more preferably satisfy the relation of: Kzz and Kyy$\geq$600 W/mK. This allows further reduction of the thermal resistance of the entire semiconductor device.

Seventh Embodiment

Figure 17:
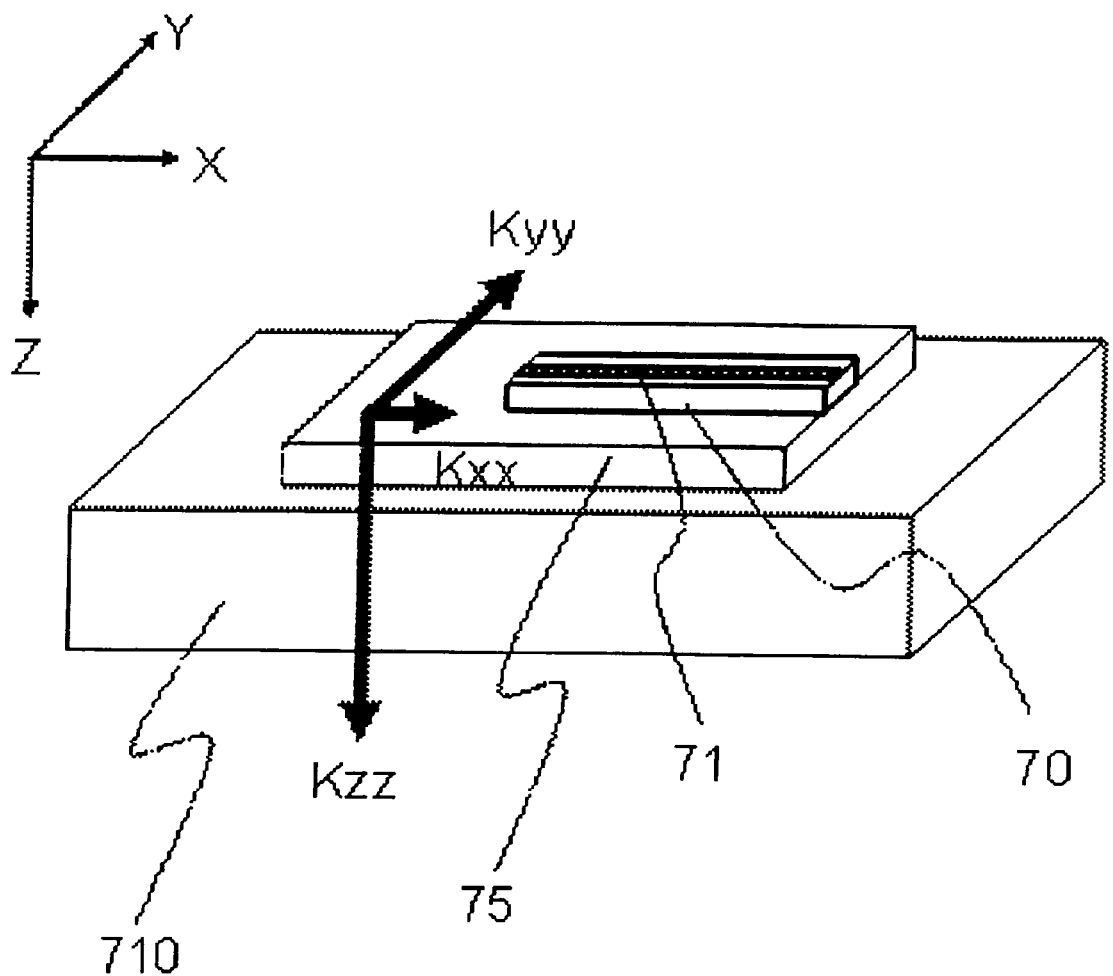
FIG. 17 is a schematic perspective view, illustrating a semiconductor device including a semiconductor element including a semiconductor element having a rectangular two-dimensional geometry and serving as a heat source, which is mounted on a package including a heat sink according to seventh embodiment of the present invention.
Figure 18:
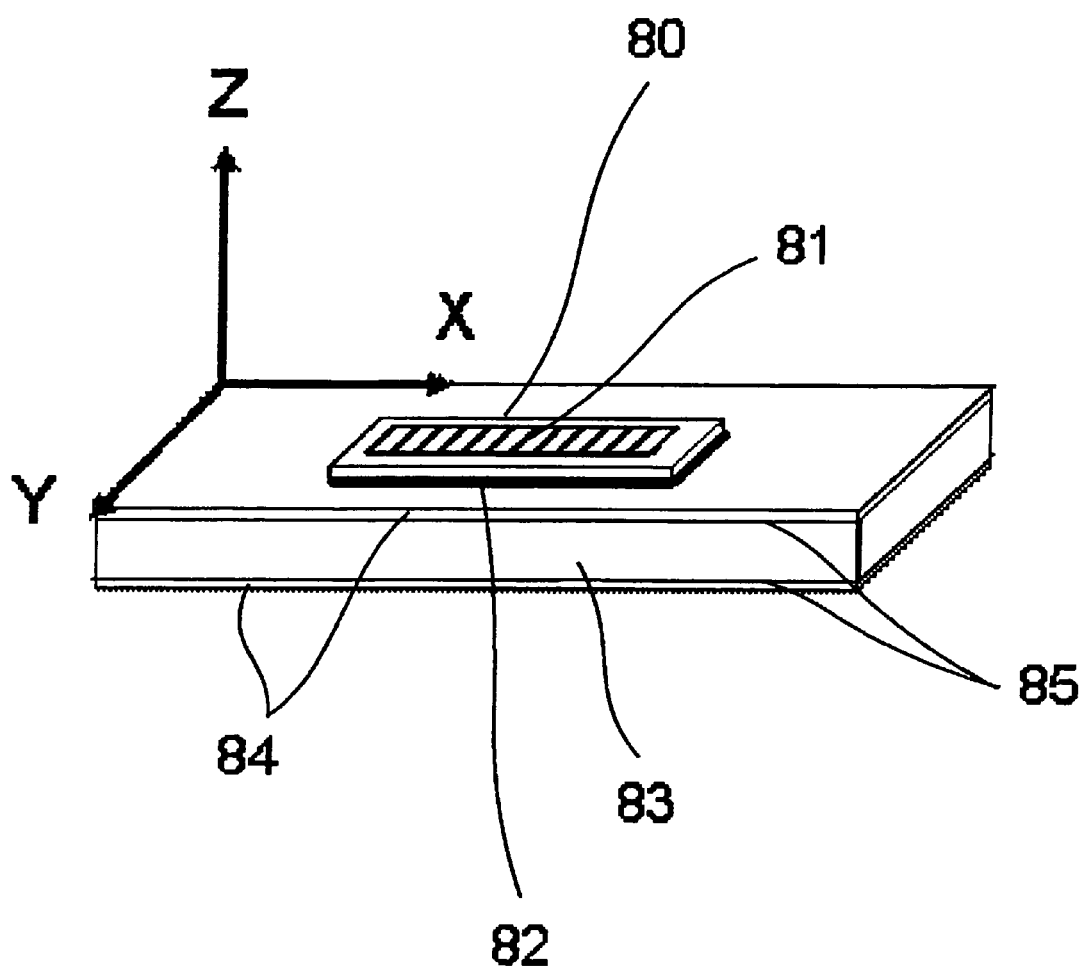
FIG. 18 is a schematic perspective view of a semiconductor device including a semiconductor element mounted on a package employed in a thermal simulation via finite element method.
Figure 19:
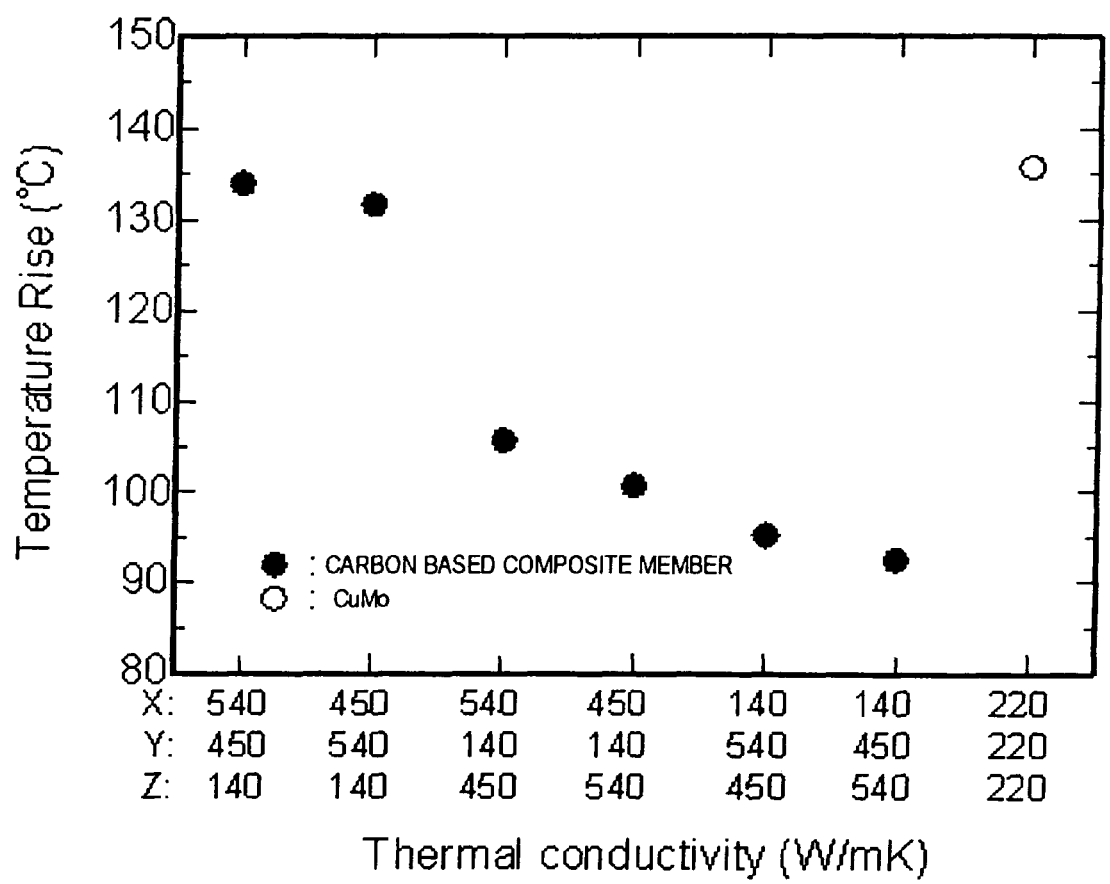
FIG. 19 it is a graph, showing results of thermal simulations carried out via finite element method.

FIG. 17 is a schematic perspective view of a semiconductor device, illustrating seventh embodiment of the present invention.

The details of the respective materials are not presented in the figures, and only sections necessary for describing the feature of the present invention are extracted to be illustrated. In FIG. 17, 70 indicates semiconductor elements, 71 indicates regions for heat generated by the semiconductor element, 75 indicates a heat sink section, and 710 indicates a stem for mounting the heat sink. In addition to above, since the configuration of the semiconductor element 70 is similar to that in the known technology, the descriptions thereof are not present.

The directional components of the three-dimensional thermal conductivity of the above-described heat sink section 75 in X, Y and X directions are determined as Kxx, Kyy and Kzz in X, Y and Z directions, where the longer side direction of the semiconductor element 70 having rectangular two-dimensional geometry is defined as X direction, the shorter side direction thereof is defined as Y direction and the thickness direction is defined as Z direction. Here, the heat sink section is composed of a composite material, which is formed by impregnating Cu or Al into a carbon fiber-reinforced carbon composite, and is disposed so as to exhibit larger thermal conductivity in Y-Z plane, and on the other hand, relatively smaller thermal conductivity in X direction, and thus the relation of Kzz$\geq$Kyy>Kxx is satisfied. Here, concerning Kyy and Kzz, when the both values are relatively closed, equivalent effect can be obtained even if these values are replaced.

The semiconductor device in the present embodiment is manufactured as follows.

First of all, in a front-end process, an electrode process and optionally a crystal growth process such as buried growth for a current confinement as required are conducted for a semiconductor device such as a laser diode composed of a semiconductor material such as gallium arsenide (GaAs), indium phosphorus (InP), gallium nitride (GaN), zinc selenide (ZnSe). Subsequently, a cleavage process or the like is conducted to form a resonator and obtain individual chips. This process allows obtaining the chips having the semiconductor elements 60 formed therein. These front-end processing operations are similar to that in the known technology, and thus the description thereof is not presented.

Subsequently, a back-end processing is conducted to mount the formed chip in a package. The semiconductor element 70 is fused bonded over the package having the heat sink section 65 supported on a mount device maintained at 300 degree C. via AuSn solder (containing 20% of Sn). Subsequently, though it is not shown, the pad electrode of the semiconductor element 70 is electrically coupled to the terminal of the package with a gold wire via a wire bonding process. Finally, the package is encapsulated, so that the semiconductor device including the heat sink section 65 having the semiconductor element 70 mounted thereon is manufactured.

Advantageous effect of the semiconductor device in the present embodiment will be described.

While a heat generated in the active region 71 of the semiconductor element 70 is conducted to the heat sink section 75 from the semiconductor element 70 as shown in FIG. 14, the direction of the above-described heat sink section 25 for exhibiting the largest thermal conductivity is oriented toward Z direction, in which a heat sink for the whole system is present, to accelerate the heat-releasing toward Z direction, and the direction for exhibiting the second largest thermal conductivity is oriented toward Y direction to achieve a heat release with an improved efficiency over the wider heat-releasing region. This allows orienting the direction for exhibiting the lowest thermal conductivity toward X direction, in which the heat-release ability region is smaller. In addition, heat interference in the region for heat generation is inhibited by reducing the thermal conductivity in X direction, achieving a secondary effect of an inhibition for the localized temperature rise in the semiconductor element. Here, concerning Kyy and Kzz, when the both values are relatively closed, equivalent effect can be obtained even if these values are replaced.

As described above, the above-described advantageous effect allows reducing the thermal resistance of the entire semiconductor device, thereby providing an improved reliability of the semiconductor element.

While the configuration of the single-layered structure described in the first and the second embodiments have been illustrated as the structure of the heat sink section in the present embodiment, other configurations such as, for example, a configuration provided with a first heat sink section right under the heat source and a second heat sink section around the above-described first heat sink as described in third embodiment, may be employed. Alternatively, a double-layered structure described in fourth and fifth embodiments may be employed. Alternatively, a metallic layer of Cu or the like may be, of course, formed in at least a front surface or a back surface of the heat sink section.

EXAMPLES

Example 1

In the cross-sectional view illustrating the example of the present invention in FIG. 2, the semiconductor element 10 was composed of, for example, GaAs FET, the heat sink section 15 was composed of a composite material, which was formed by impregnating Cu into a carbon fiber-reinforced carbon composite, the thermal conductivities in the respective directions were: Kxx=450 W/mK, Kyy=150 W/mK, Kzz=550 W/mK, and the thickness was 1.3 mm. A two-dimensional geometry of the semiconductor element 10 serving as the heat source was a rectangle of 1 mm×4 mm.

Comparative Example 1

In the configuration equivalent to the above-described Example 1 was also employed, except that a conventional material of CuMo exhibiting isotropic thermal conductivity of 220 W/mK was employed for the heat sink section 15.

Example 2

In the cross-sectional view illustrating the example of the present invention in FIG. 3, the semiconductor element 10 was composed of, for example, GaAs FET, the heat sink section 15 was composed of a composite material, which was formed by impregnating Cu into a carbon fiber-reinforced carbon composite, the thermal conductivities in the respective directions were: Kxx=450 W/mK, Kyy=100 W/mK, Kzz=550 W/mK, and the thickness was 1.3 mm. Further, in FIG. 12, thin layer structure made of Cu, and having a thickness 40 to 60 μm, was firmly adhered onto a front surface and a back surface of a composite material by utilizing a bonding layer composed of a metal to provide a sandwich structure. A two-dimensionaligeometry of the semiconductor element 10 serving as the heat source was a rectangle of 1 mm×4 mm.

Comparative Example 2

In the configuration equivalent to the above-described Example 2 was also employed, except that a conventional material of CuMo exhibiting isotropic thermal conductivity of 220 W/mK was employed for the heat sink section 15.

Example 3

In the cross-sectional view illustrating the example of the present invention in FIG. 5, the semiconductor element 20 was composed of, for example, GaN FET, the heat sink section 25 was composed of a composite material, which was formed by impregnating Cu into a carbon fiber-reinforced carbon composite, the thermal conductivities in the respective directions were: Kxx=150 W/mK, Kyy=450 W/mK, Kzz=550 W/mK, and the thickness was 1.3 mm. A two-dimensional geometry of the semiconductor element 20 serving as the heat source was a rectangle of 1 mm×4 mm.

Comparative Example 3

In the configuration equivalent to the above-described Example 3 was also employed, except that a conventional material of CuMo exhibiting isotropic thermal conductivity of 220 W/mK was employed for the heat sink section 25.

Example 4

In the cross-sectional view illustrating the example of the present invention in FIG. 6, the semiconductor element 20 was composed of, for example, GaN FET, the heat sink section 25 was composed of a composite material, which was formed by impregnating Cu into a carbon fiber-reinforced carbon composite, the thermal conductivities in the respective directions were: Kxx=150 W/mK, Kyy=450 W/mK, Kzz=550 W/mK, and the thickness was 1.3 mm. Further, in FIG. 12, thin layer structure made of Cu, and having a thickness 40 to 60 μm, was firmly adhered onto a front surface and a back surface of a composite material by utilizing a bonding layer composed of a metal to provide a sandwich structure. A two-dimensional geometry of the semiconductor element 20 serving as the heat source was a rectangle of 1 mm×4 mm.

Comparative Example 4

In the configuration equivalent to the above-described Example 2 was also employed, except that a conventional material of CuMo exhibiting isotropic thermal conductivity of 220 W/mK was employed for the heat sink section 25.

Example 5

In the cross-sectional view illustrating the example of the present invention in FIG. 8, the semiconductor element 30 was composed of, for example, GaAs FET, the heat sink sections 36 and 37 were composed of composite materials, which were formed by impregnating Cu into carbon fiber-reinforced carbon composite, the thermal conductivities in the respective directions of the first and the second heat sink sections 36 and 37 were: $K1xx=100$ W/mK, $K1yy=450$ W/mK, $K1zz=550$ W/mK, and the thickness was 1.3 mm, and $K2xx=450$ W/mK, $K2yy=550$ W/mK, $K2zz=100$ W/mK, and the thickness was 1.3 mm. A two-dimensional geometry of the semiconductor element 30 serving as the heat source was a rectangle of 1 mm×4 mm.

Comparative Example 5

In the configuration equivalent to the above-described Example 5 was also employed, except that a conventional material of CuMo exhibiting isotropic thermal conductivity of 220 W/mK was employed for the heat sink sections 36 and 37.

Example 6

In the cross-sectional view illustrating the example of the present invention in FIG. 9, the semiconductor element 30 was composed of, for example, GaAs FET, the heat sink sections 36 and 37 were composed of composite materials, which were formed by impregnating Al into carbon fiber-reinforced carbon composite, the thermal conductivities in the respective directions of the first and the second heat sink sections 36 and 37 were: $K1xx=100$ W/mK, $K1yy=500$ W/mK, $K1zz=600$ W/mK, and the thickness was 1.3 mm, and $K2xx=500$ W/mK, $K2yy=600$ W/mK, $K2zz=100$ W/mK, and the thickness was 1.0 mm. Further, in FIG. 12, thin layer structure made of Cu, and having a thickness 40 to 60 µm, was firmly adhered onto a front surface and a back surface of a composite material by utilizing a bonding layer composed of a metal to provide a sandwich structure. A two-dimensional geometry of the semiconductor element 30 serving as the heat source was a rectangle of 1 mm×4 mm.

Comparative Example 6

In the configuration equivalent to the above-described Example 6 was also employed, except that a conventional material of CuMo exhibiting isotropic thermal conductivity of 220 W/mK was employed for the heat sink sections 36 and 37.

Example 7

In the cross-sectional view illustrating the example of the present invention in FIG. 11, the semiconductor element 40 was composed of, for example, a laterally diffused MOS (LD MOS) of Si, the heat sink sections 46 and 47 were composed of composite materials, which were formed by impregnating Cu into carbon fiber-reinforced carbon composite, the thermal conductivities in the respective directions of the first and the second heat sink sections 46 and 47 were: $K1xx=450$ W/mK, $K1yy=550$ W/mK, $K1zz=100$ W/mK, and the thickness was 0.3 mm, and $K2xx=100$ W/mK, $K2yy=450$ W/mK, $K2zz=550$ W/mK, and the thickness was 1.0 mm. A two-dimensional geometry of the semiconductor element 10 serving as the heat source was a rectangle of 1 mm×4 mm.

Comparative Example 7

In the configuration equivalent to the above-described Example 3 was also employed, except that a conventional material of CuMo exhibiting isotropic thermal conductivity of 220 W/mK was employed for the heat sink sections 46 and 47.

Example 8

In the cross-sectional view illustrating the example of the present invention in FIG. 12, the semiconductor element 40 was composed of, for example, a laterally diffused MOS (LD MOS) of Si, the heat sink sections 46 and 47 were composed of composite materials, which were formed by impregnating Al into carbon fiber-reinforced carbon composite, the thermal conductivities in the respective directions of the first and the second heat sink sections 46 and 47 were: $K1xx=500$ W/mK, $K1yy=600$ W/mK, $K1zz=100$ W/mK, and the thickness was 0.3 mm, and $K2xx=100$ W/mK, $K2yy=500$ W/mK, $K2zz=600$ W/mK, and the thickness was 1.0 mm. Further, in FIG. 12, thin layer structure made of Cu, and having a thickness 40 to 60 µm, was firmly adhered onto a front surface and a back surface of a composite material by utilizing a bonding layer composed of a metal to provide a sandwich structure. A two-dimensional geometry of the semiconductor element 40 serving as the heat source was a rectangle of 1 mm×4 mm.

Comparative Example 8

In the configuration equivalent to the above-described Example 8 was also employed, except that a conventional material of CuMo exhibiting thermal conductivity of 220 W/mK was employed for the heat sink sections 46 and 47.

Example 9

In the cross-sectional view illustrating the example of the present invention in FIG. 14, the semiconductor element 50 was composed of, for example, GaN FET, the first heat sink section 56 was composed of a composite material, which was formed by impregnating Cu into carbon fiber-reinforced carbon composite, and the second heat sink 57 was composed of a metallic material exhibiting isotropic thermal conductivity. The thermal conductivities in the respective directions of the first heat sink section 56 were: $K1xx=450$ W/mK, $K1yy=550$ W/mK, $K1zz=100$ W/mK, and the thickness was 0.3 mm. The second heat sink section 57 was composed of Ag exhibiting thermal conductivity of $K2=420$ W/mK, and having the thickness of 1.0 mm. A two-dimensional geometry of the semiconductor element 50 serving as the heat source was a rectangle of 1 mm×4 mm.

Comparative Example 9

In the configuration equivalent to the above-described Example 9 was also employed, except that a conventional material of CuMo exhibiting isotropic thermal conductivity of 220 W/mK was employed for the heat sink sections 56 and 57.

Example 10

In the cross-sectional view illustrating the example of the present invention in FIG. 15, the semiconductor element 50 was composed of, for example, GaN FET, the first heat sink section 56 was composed of a composite material, which was formed by impregnating Al into carbon fiber-reinforced carbon composite, and the second heat sink 57 was composed of diamond exhibiting isotropic thermal conductivity. The thermal conductivities in the respective directions of the first heat sink section 56 were: K1$xx$=500 W/mK, K1$yy$=600 W/mK, K1$zz$=100 W/mK, and the thickness was 0.3 mm, and the dimensional size thereof in X-Y plane was presented to meet a dimensional size, in which the semiconductor element 50 and the matching circuit substrate 52 can be mounted (so-called sub mount structure). The second heat sink section 57 was composed of synthetic diamond exhibiting thermal conductivity of 500 W/mK, and having the thickness of 1.0 mm. A two-dimensional geometry of the semiconductor element 50 serving as the heat source was a rectangle of 1 mm×5 mm.

Comparative Example 10

In the configuration equivalent to the above-described Example 10 was also employed, except that a conventional material of CuMo exhibiting isotropic thermal conductivity of 220 W/mK was employed for the heat sink sections 56 and 57.

Example 11

In the cross-sectional view illustrating the example of the present invention in FIG. 16, the semiconductor elements 60 (four elements) were composed of, for example, GaAs FET, the heat sink sections 65 were composed of a composite material, which was formed by impregnating Al into carbon fiber-reinforced carbon composite, the thermal conductivities in the respective directions were: Kxx=100 W/mK, Kyy=500 W/mK, Kzz=600 W/mK, and the thickness was 1.3 mm. A two-dimensional geometry of the semiconductor element 10 serving as the heat source was a rectangle of 1 mm×4 mm.

Comparative Example 11

In the configuration equivalent to the above-described Example 11 was also employed, except that a conventional material of CuMo exhibiting isotropic thermal conductivity of 220 W/mK was employed for the heat sink sections 65.

Example 12

In the cross-sectional view illustrating the example of the present invention in FIG. 17, the semiconductor element 70 was composed of, for example, GaAs-based semiconductor laser diode (LD), the heat sink section 75 was composed of a composite material, which was formed by impregnating Al into carbon fiber-reinforced carbon composite, the thermal conductivities the heat sink section 75 in the respective directions were: Kxx=100 W/mK, Kyy=500 W/mK, Kzz=600 W/mK, and the thickness was 1.0 mm. This was mounted on a stem 710 made of Cu in a package with AuSn solder. A two-dimensional geometry of the semiconductor element 70 serving as the heat source was a rectangle of 300 μm×600 μm.

While the GaAs based laser diode is employed for the semiconductor element 70 in the present example, the available device is not limited thereto, and the present invention may also be applied to an InP based laser diode, a GaN based laser diode, a ZnSe based laser diode and the like. Alternatively, the available device is not limited to the laser diode, and the present invention may also be applied to a light emitting diode.

Comparative Example 12

In the configuration equivalent to the above-described Example 12 was also employed, except that a conventional material of CuMo exhibiting isotropic thermal conductivity of 200 W/mK was employed for the heat sink section 75.

The temperature rises in the channel in the case that the power consumption of the semiconductor element was 50 W were measured in Examples 1 to 10 and Comparative Example 1 to 10.

The temperature rises in the channel in the case that the power consumption per semiconductor element is 50 W were also measured in Example 11 and Comparative Example 11.

The temperature rises in the bonding in the case that the power consumption of the semiconductor element is 1 W were also measured in Example 12 and Comparative Example 12. The respective results are shown in the following Table 1.

TABLE 1

| | THERMAL CONDUCTIVITY OF PACKAGE OR FIRST PACKAGE (W/mK) | | | THERMAL CONDUCTIVITY OF SECOND PACKAGE (W/mK) | | | RESULTS TEMPERATURE ELEVATION (C.°) |
|---|---|---|---|---|---|---|---|
| | kxx or k1xx | kyy or k1yy | kzz or k1zz | k2xx | k2yy | k2zz | |
| Example 1 | 450 | 150 | 550 | — | — | — | 55 |
| Comparative Example 1 | 220 | 220 | 220 | — | — | — | 80 |
| Example 2 | 450 | 150 | 550 | — | — | — | 60 |
| Comparative Example 2 | 220 | 220 | 220 | — | — | — | 80 |
| Example 3 | 150 | 450 | 550 | — | — | — | 45 |
| Comparative Example 3 | 220 | 220 | 220 | — | — | — | 80 |
| Example 4 | 150 | 450 | 550 | — | — | — | 50 |
| Comparative Example 4 | 220 | 220 | 220 | — | — | — | 80 |
| Example 5 | 100 | 450 | 550 | 450 | 550 | 100 | 45 |
| Comparative Example 5 | 220 | 220 | 220 | 220 | 220 | 220 | 80 |
| Example 6 | 100 | 500 | 600 | 500 | 600 | 100 | 40 |
| Comparative Example 6 | 220 | 220 | 220 | 220 | 220 | 220 | 80 |
| Example 7 | 450 | 550 | 100 | 100 | 450 | 550 | 45 |
| Comparative Example 7 | 220 | 220 | 220 | 220 | 220 | 220 | 80 |
| Example 8 | 500 | 600 | 100 | 100 | 500 | 600 | 40 |
| Comparative Example 8 | 220 | 220 | 220 | 220 | 220 | 220 | 80 |
| Example 9 | 450 | 550 | 100 | 420 | 420 | 420 | 45 |

TABLE 1-continued

| | THERMAL CONDUCTIVITY OF PACKAGE OR FIRST PACKAGE (W/mK) | | | THERMAL CONDUCTIVITY OF SECOND PACKAGE (W/mK) | | | RESULTS |
|---|---|---|---|---|---|---|---|
| | kxx or k1xx | kyy or k1yy | kzz or k1zz | k2xx | k2yy | k2zz | TEMPERATURE ELEVATION (C.°) |
| Comparative Example 9 | 220 | 220 | 220 | 220 | 220 | 220 | 80 |
| Example 10 | 500 | 600 | 100 | 500 | 500 | 500 | 35 |
| Comparative Example 10 | 220 | 220 | 220 | 220 | 220 | 220 | 80 |
| Example 11 | 100 | 500 | 600 | — | — | — | 50 |
| Comparative Example 11 | 220 | 220 | 220 | — | — | — | 80 |
| Example 12 | 100 | 500 | 600 | — | — | — | 10 |
| Comparative Example 12 | 200 | 200 | 200 | — | — | — | 30 |

The present invention has been described in reference to the above-described embodiments, and it is not intended to limit the present invention to only the above-described embodiments, various types of aspects according to the basis of the present invention are, of course included therein. Any arbitrary combination of each of these constitutions or conversions between the categories of the invention such as a process, a device, a method for utilizing the device and the like may also be available in light of the scope of the present invention.

While the composite materials, which were formed by impregnating Cu or Al into carbon fiber-reinforced carbon composite, were employed for the material having anisotropic thermal conductivity in the above-described embodiments, other types of materials exhibiting anisotropy in the thermal conductivity may alternatively be employed.

For example, other type of material may also be preferable provided that the material is a composite material at least including carbon. The carbon based composite material, which is different from the composite materials employed in the above-described embodiments, carbon based composite materials, which is formed by impregnating other type of metal, black-lead, carbon fiber, carbon nanotube, carbon nanowire, monocrystalline silicon carbide (SiC) may alternatively be employed.

The anisotropy of the thermal conductivity in the heat sink section was provided as about 1:5:6 in the above-described embodiments. Nevertheless, in the condition that the ratio in the size of the longer side direction and the short side direction of the semiconductor element is about 1:4 as in the above-described example, the thermal resistance of the whole system is reduced by providing further increased value of the largest and the second largest directions in the anisotropic thermal conductivity, concerning the anisotropy of the thermal conductivity. In such case, the value of the thermal conductivity in the direction providing the smallest is reduced, resulting in further increased level of the anisotropy. The ratio of the respective directions of the thermal conductivity may be arbitrarily selected, in consideration of the geometry of the semiconductor element under the condition that the thermal conductivities in the arbitrary two directions are larger than the thermal conductivity of the other one direction.

Alternatively, the semiconductor element having the rectangular geometry may have substantially rectangular geometry. The element may also preferably have longer heat-releasing portion in X-Y plane, which is contributory to provide lower thermal resistance.

While each of the directions X, Y and Z of the composite material is in parallel with each of the sides of the semiconductor element having rectangular geometry in the above-described embodiments, the directions may alternatively be inclined to achieve the present invention within the range that is not harmful for the principle of the present invention. However, since the principle of the present invention tends to be deteriorated as the inclination angle is increased, it is preferable to provide inclinations within about 10 degrees for the respective directions.

Further, the geometry, the size, and the configuration of the package are not limited to that described in the above-described embodiments.

The semiconductor elements in the present invention include electronic devices such as field effect transistor, bipolar transistor and the like, and further, laser diodes, light emitting diodes and the like, optical devices, solar cells and the like.

While Si LDMOS, GaAs FET, GaN FET and GaAs based LD have been exemplified as the semiconductor element in the above-described examples, other types of the semiconductor elements such as, for example, insulated gate bipolar transistor (IGBT) utilizing Si or SiC may alternatively be employed to achieve the present invention.

While the case of employing a transistor of a unit element has been exemplified in the above-described example, a microwave monolithic integrated circuit (MMIC) may alternatively be employed to achieve the present invention. In this case, the two-dimensional geometry of the whole semiconductor chip is not necessarily coincide with the geometries of the respective semiconductor elements included therein, unlike the case of employing the unit element, and a semiconductor element having a rectangular two-dimensional geometry and serving as a heat source may be employed for the semiconductor element generating the largest heat, and the longer side direction may be defined as X direction, the shorter side direction may be defined as Y direction, and the thickness direction may be defined as Z direction. Further, the material of the semiconductor element available in the present invention may include silicon (Si), gallium arsenide (GaAs), indium phosphide (InP), gallium nitride (GaN), silicon carbide (SiC), zinc selenide (ZnSe) and the like. While the power amplifiers and the laser diodes have been exemplified as the semiconductor devices, the present invention is not limited thereto, and other types of devices such as switches may alternatively be employed to achieve the present invention, provided that a temperature increase is caused in the bonding by a self heating.

The invention claimed is:

1. A semiconductor device, comprising:
a semiconductor element having a rectangular two-dimensional geometry and serving as a heat source;

a first heat sink section comprising said semiconductor element mounted thereon; and a second heat sink section joined to an opposite side of said first heat sink section that comprises said semiconductor element, wherein a relation among directional components of a thermal conductivity of said first heat sink section is:

$K1yy \geqq K1xx > K1zz$, wherein the thermal conductivity of said first heat sink section is defined as K1, and directional components of a three-dimensional thermal conductivity of said first heat sink section in X, Y, and Z directions are determined as $K1xx$, $K1yy$, and $K1zz$, and wherein a relation among directional components of a thermal conductivity of said second heat sink section is:

$K2zz \geqq K2yy > K2xx$ or $K2yy \geqq K2zz > K2xx$, wherein the thermal conductivity of said second heat sink section is defined as K2, and the directional components of the thermal conductivity of said second heat sink section in X, Y, and Z directions are determined as $K2xx$, $K2yy$, and $K2zz$.

2. The semiconductor device as set forth in claim 1, wherein one of said first heat sink section and said second heat sink section comprises metallic layers in at least a front surface and a back surface thereof.

3. The semiconductor device as set forth in claim 2, wherein a bonding layer is included in an interface between said metallic layer and said one of said first heat sink section and said second heat sink section.

4. The semiconductor device as set forth in claim 1, wherein the semiconductor element comprises a plurality of ones of said semiconductor element, and wherein said plurality of ones of said semiconductor element are aligned in series along a longer side direction of said semiconductor element.

5. The semiconductor device as set forth in claim 1, wherein at least two directional components of said thermal conductivity of one of said first heat sink section and said second heat sink section in X, Y, and Z directions are equal to or higher than 600 W/mK, said one of said first heat sink section and said second heat sink section having an anisotropic thermal conductivity.

6. The semiconductor device as set forth in claim 1, wherein one of said first heat sink section and said second heat sink section comprises a composite material including at least carbon.

7. The semiconductor device as set forth in claim 1, wherein one of said first heat sink section and said second heat sink section comprises a composite material, and each of directions of a three-dimensional thermal conductivity of said composite material, determined as Kxx, Kyy, and Kzz, is inclined within about 10 degrees from each of the directions X, Y, and Z of said semiconductor element.

8. The semiconductor device as set forth in claim 1, wherein the three-dimensional thermal conductivity of said first heat sink section is different from the thermal conductivity of said second heat sink section.

9. The semiconductor device as set forth in claim 1, wherein a longer side direction of the semiconductor element is defined as the X direction, a shorter side direction of the semiconductor element is defined as the Y direction, and a thickness direction of the semiconductor element is defined as the Z direction.

10. The semiconductor device as set forth in claim 1, wherein, in the first heat sink section, a direction exhibiting a largest thermal conductivity of the first heat sink section is oriented toward an X-Y plane.

11. The semiconductor device as set forth in claim 10, wherein, in the second heat sink section, a direction for exhibiting a largest thermal conductivity is oriented toward the Z direction.

* * * * *